(12) United States Patent
Chang et al.

(10) Patent No.: US 12,713,703 B2
(45) Date of Patent: Aug. 18, 2026

(54) POWER GATING CELL STRUCTURE

(71) Applicant: Taiwan Semiconductor Manufacturing Company, Ltd., Hsinchu (TW)

(72) Inventors: Wei-Ling Chang, Hsinchu City (TW); Jung-Chan Yang, Taoyuan County (TW); Li-Chun Tien, Tainan City (TW); Ting Yu Chen, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 446 days.

(21) Appl. No.: 18/447,999

(22) Filed: Aug. 10, 2023

(65) Prior Publication Data

US 2024/0063211 A1 Feb. 22, 2024

Related U.S. Application Data

(62) Division of application No. 17/021,045, filed on Sep. 15, 2020, now Pat. No. 11,862,620.

(51) Int. Cl.

*H10D 84/83* (2025.01)
*H03K 19/17772* (2020.01)
*H10D 84/01* (2025.01)
*H10D 84/03* (2025.01)
*H10D 89/10* (2025.01)

(52) U.S. Cl.

CPC ....... *H10D 89/10* (2025.01); *H03K 19/17772* (2013.01); *H10D 84/0149* (2025.01); *H10D 84/0158* (2025.01); *H10D 84/038* (2025.01); *H10D 84/834* (2025.01)

(58) Field of Classification Search

None

See application file for complete search history.

(56) References Cited

U.S. PATENT DOCUMENTS

| | | | |
|---|---|---|---|
| 10,797,042 | B2 | 10/2020 | Wang et al. |
| 11,080,453 | B2 | 8/2021 | Huang et al. |
| 2008/0012424 | A1 | 1/2008 | Shin et al. |
| 2017/0301586 | A1 | 10/2017 | Sio et al. |
| 2017/0329885 | A1 | 11/2017 | Chae et al. |

(Continued)

FOREIGN PATENT DOCUMENTS

| | | |
|---|---|---|
| CN | 110634860 A | 12/2019 |
| CN | 111129000 A | 5/2020 |

(Continued)

*Primary Examiner* — Steven B Gauthier
*Assistant Examiner* — Lamont B Koo
(74) *Attorney, Agent, or Firm* — Merchant & Gould P.C.

(57) ABSTRACT

A power gating cell on an integrated circuit is provided. The power gating cell includes: a central area; a peripheral area surrounding the central area; a first active region located in the central area, the first active region having a first width in a first direction corresponding to at least four fin structures extending in a second direction perpendicular to the first direction; and a plurality of second active regions located in the peripheral area, each second active region having a second width in the first direction corresponding to at least one and no more than three fin structures extending in the second direction.

20 Claims, 25 Drawing Sheets

(56) References Cited

U.S. PATENT DOCUMENTS

| | | | |
|---|---|---|---|
| 2018/0145070 A1* | 5/2018 | Fan | H10D 89/10 |
| 2018/0151559 A1 | 5/2018 | Sio et al. | |
| 2019/0198496 A1 | 6/2019 | Oh et al. | |
| 2020/0082045 A1 | 3/2020 | Lee | |
| 2021/0082815 A1 | 3/2021 | Doornbos | |

FOREIGN PATENT DOCUMENTS

| | | | |
|---|---|---|---|
| DE | 10 2019 127 073 | A1 | 3/2021 |
| JP | 2019-54297 | A | 4/2019 |
| KR | 10-2007-0109415 | A | 11/2007 |
| KR | 10-2017-0127340 | A | 11/2017 |
| TW | 201737491 | A | 10/2017 |
| WO | 2013/106799 | A1 | 7/2013 |

* cited by examiner

102 { 102h, 102f }

POWER GATING CELL STRUCTURE

This application is a divisional of U.S. patent application Ser. No. 17/021,045 filed Sep. 15, 2020, entitled "POWER GATING CELL STRUCTURE", the entire disclosure of which is hereby incorporated by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the mainstream course of IC evolution, functional density (i.e., the number of interconnected devices per chip area) has generally increased while geometry size (i.e., the smallest component that can be created using a fabrication process) has decreased. However, this mainstream evolution needs to follow the Moore's rule by a huge investment in facility establishment. Therefore, it has been a constant need to develop ICs with smaller chip areas, lower costs, and better power conversion efficiency.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
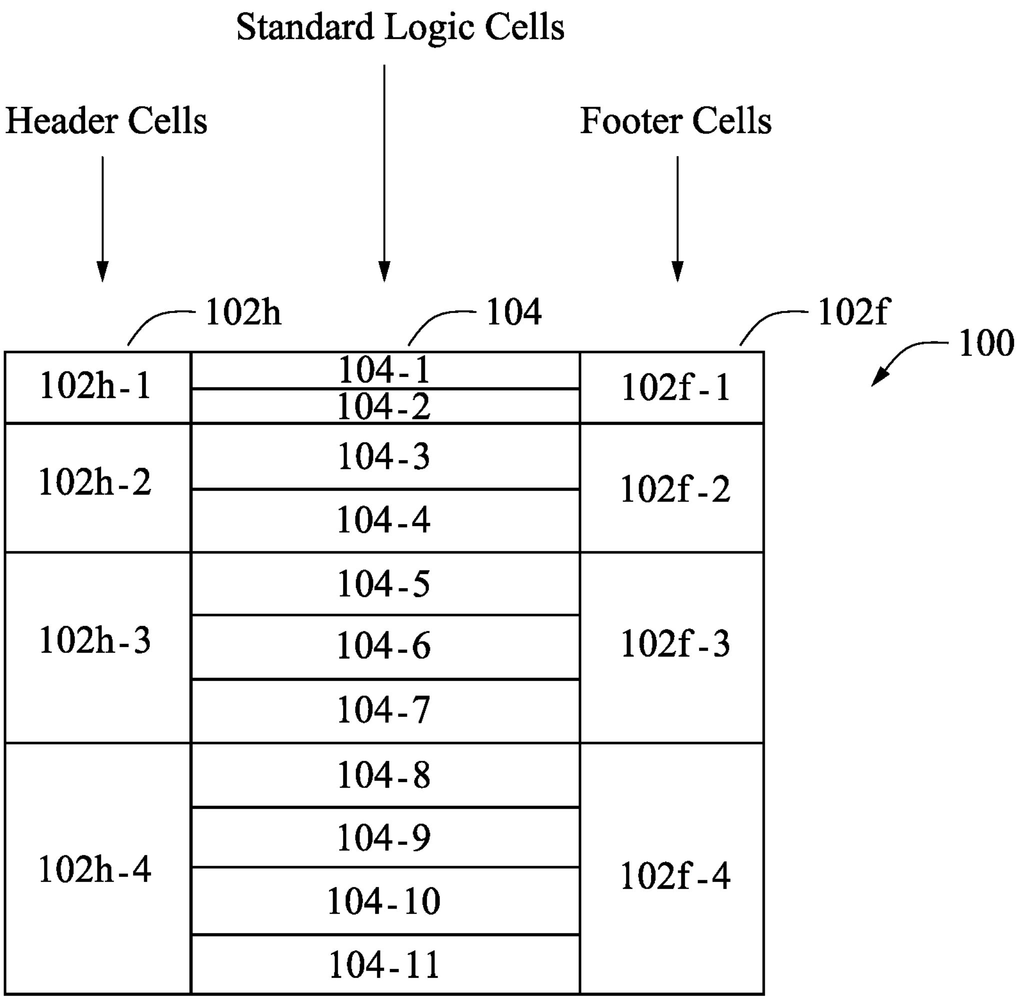
FIG. 1 is a block diagram illustrating an integrated circuit (IC) layout that incorporates header cells and/or footer cells (collectively, "power gating cells") in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In today's standard-logic-cell based application specific integrated circuit (ASIC) design, the logic function of the chip is modeled and simulated in higher-level hardware description languages (e.g., VHDL or VERILOG). It is then synthesized in a silicon compiler (e.g. SYNOPSIS) to generate a netlist using standard logic cells from a targeted standard-cell library. The netlist will be used in the backend physical design phase to perform the "Place and Route" of standard logic cells, generating the full circuit layout of the ASIC for manufacturing.

Header switches and footer switches (collectively, "power gating cells") on a chip are used to cut off power supplies to certain standard logic cells in a standby mode or a sleep mode to save power consumption of the chip. Header switches and footer switches are typically low-leakage metal-oxide-silicon (MOS) transistors. In some embodiments, header switches and footer switches are fin field-effect transistors (FinFETs). Header switches and footer switches are generally placed in header cells and footer cells respectively beside standard logic cells. However, under the established architecture, layouts of header cells and footer cells require large chip areas, high costs and relatively high power consumption.

In accordance with some aspects of the present disclosure, a power gating cell includes: a wide active region located in a central area of the power gating cell and multiple normal active regions located in a peripheral area surrounding the central area. A normal active region is an active region with one, two, or three fin structures, while a wide active regions is an active region with more than three fin structures. Since the wide active regions has a better usage of chip area, the power gating cell can result in a smaller chip area than conventional cell layouts do, under the same active region area. From another perspective, the power gating cell can have a larger active region area compared with conventional cells with the same size. As a result, the larger active region area of the wide active region results in a smaller IR drop of the power gating cell. In summary, the power gating cell with a wide active region in the central area can achieve a smaller chip area and better power conversion efficiency.

FIG. 1 is a block diagram illustrating an integrated circuit (IC) layout that incorporates header cells and/or footer cells (collectively, "power gating cells") in accordance with some embodiments. Header cells, footer cells, and standard logic cells are placed on the IC layout. The header cells and footer cells have various layout structures as described with reference to FIGS. 2A to 20 (except FIGS. 2B and 2C). In the illustrated example in FIG. 1, an IC layout 100 includes, among other things, multiple standard logic cells 104, multiple header cells 102*h* to the left of the multiple standard logic cells 104, and multiple footer cells 102*f* to the right of the multiple standard logic cells 104. The multiple header cells 102*h* and the multiple footer cells 102*f* are collectively called power gating cells 102. Each of the multiple standard logic cells 104 (e.g., 104-1) may fulfil its specific function (s). Each of the multiple standard logic cells 104 (e.g., 104-1) is connected to at least one header cell 102*h* (e.g., 102*h*-1) and at least one footer cell 102*f* (e.g., 102*f*-1) which is controlled to cut off the power supply to the controlled standard logic cell (e.g., 104-1) in a standby mode or a sleep mode. In one example, each of the header cells 102*h* includes at least one low-leakage PMOS transistor, while each of the footer cells 102*f* includes at least one low-leakage NMOS transistor.

Figure 2A:
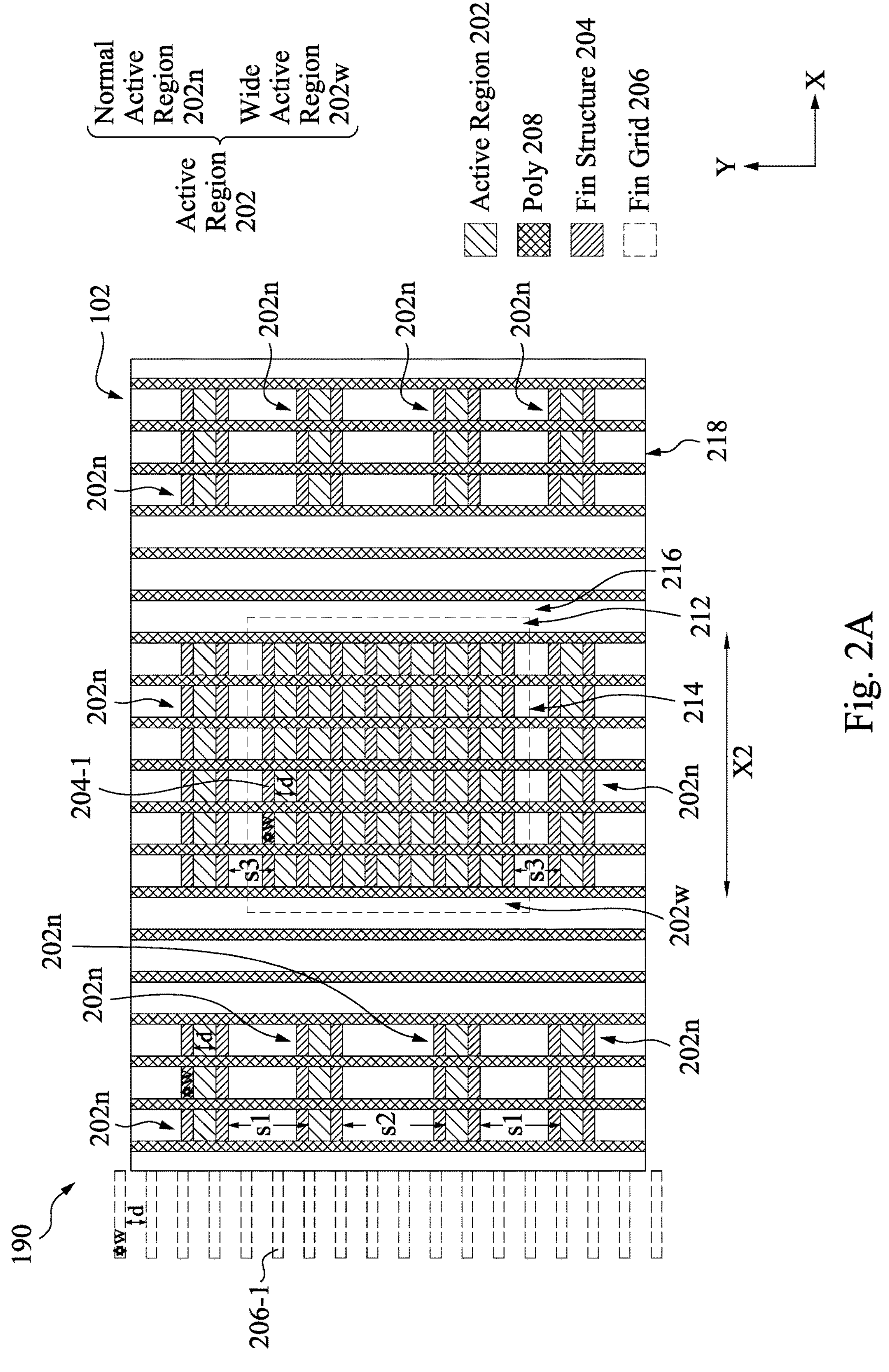
FIG. 2A is a diagram illustrating a power gating cell in accordance with some embodiments.
Figure 2B:
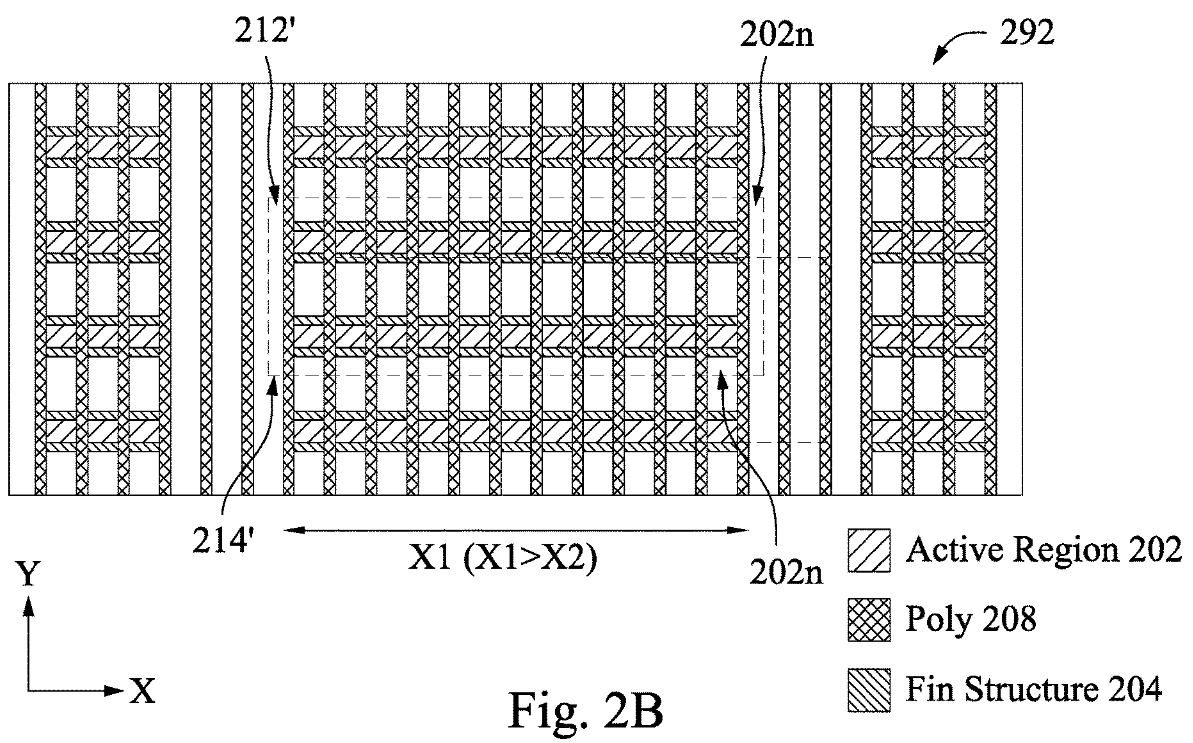
FIG. 2B is a diagram illustrating a first benchmark power gating cell to be compared with the power gating cell of FIG. 2A.
Figure 2C:
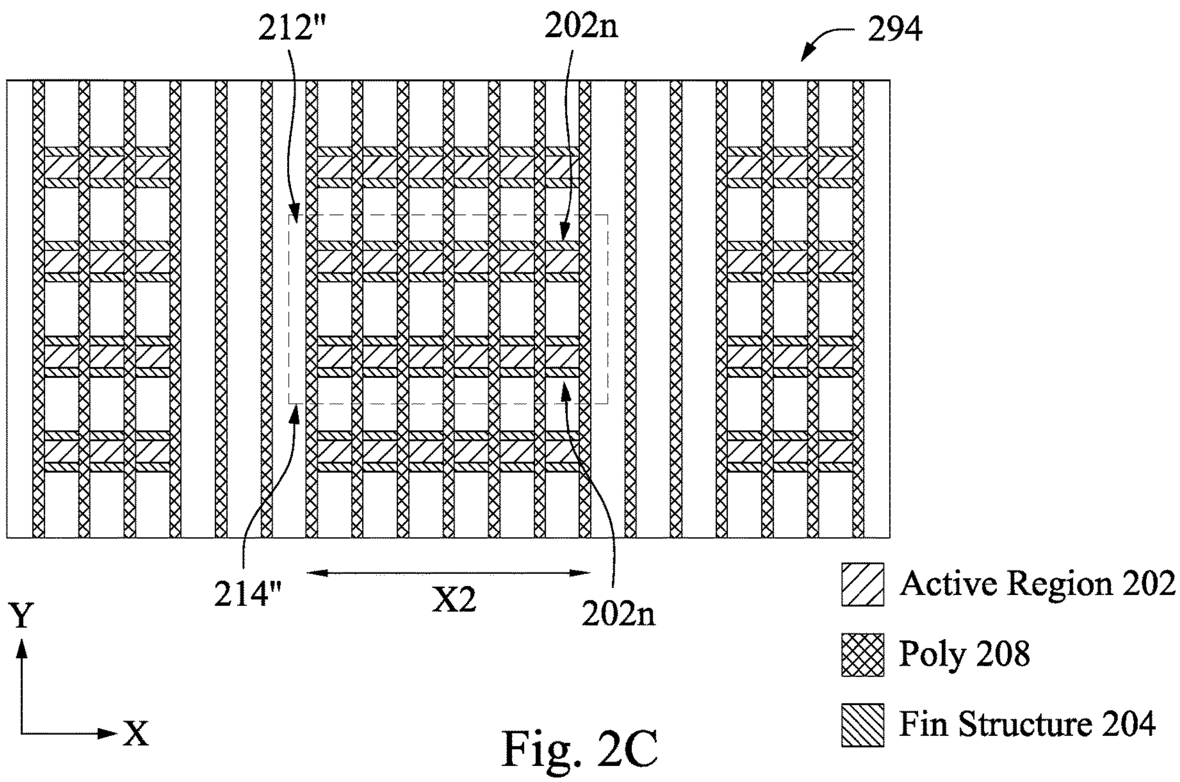
FIG. 2C is a diagram illustrating a second benchmark power gating cell to be compared with the power gating cell of FIG. 2A.

FIG. 2A is a diagram illustrating a power gating cell 102 in accordance with some embodiments. FIG. 2B is a diagram illustrating a first benchmark power gating cell 292 to be compared with the power gating cell 102 of FIG. 2A. FIG. 2C is a diagram illustrating a second benchmark power gating cell 294 to be compared with the power gating cell 102 of FIG. 2A. As shown in FIG. 2A, the power gating cell 102 may be either a header cell 102*h* or a footer cell 102*f*, as shown in FIG. 1.

The power gating cell 102, located on a substrate 190, has a boundary 218. There are multiple active regions 202 located within the boundary 218. Fin structures 204 are disposed on the active regions 202. The fin structures 204 extend in an X direction. The fin structures 204 may serve as gates, sources, or drains of transistors as needed. Gate strips (i.e., poly strips) 208 are disposed on the fin structures 204 or the active regions 202. The gate strips 208 extend in a Y direction perpendicular to the X direction. The fin structures 204 that are under the gate strips 208 may serve as gates of transistors as needed.

Generally, there are two categories of active regions 202: wide active regions 202*w* and normal active regions 202*n*. A normal active region 202*n* is an active region 202 with one, two, or three fin structures 204. On the other hand, a wide active regions 202*w* is an active region 202 with more than three fin structures 204. In the illustrated example in FIG. 2A, one wide active region 202*w* is located in the middle of the power gating cell 102. More specifically, the wide active region 202*w* is located in a central area 212 of the power gating cell 102 within a boundary 214. The illustrated wide active region 202*w* has eight fin structures 204. The illustrated wide active region 202*w* has a length of X2 in the X direction. On the other hand, ten normal active regions 202*n* are located in a peripheral area 216 of the power gating cell 102. The peripheral area 216 is the area outside the boundary 214 but inside the boundary 218. Each of the ten normal active regions 202*n* has two fin structures 204.

Due to fabrication process limitations (e.g., fin structure pitch), there is an upper limit of the number of fin structures 204 within a chip of a unit size. As a result, there are fin grids 206 of an IC layout which reflects a situation in which the maximum number of fin structures 204 are placed. In other words, the fin grids 206 are references, and not a real fin structure 204 is necessarily placed at the location of each fin grid 206. Assuming that a fin structure 204 has a width of w in the Y direction and the distance between two neighboring fin structures 204 is d, a fin structure pitch p is equal to (w+d). Distances s1, s2, and s3 shown in FIG. 2A has the relationship below:

$$s1 \neq s2 \neq s3 \neq (w+d)*n,$$

where n is an integer.

Generally, the normal active regions 202*n* that are located in the peripheral area 216 of the power gating cell 102 are off-grid due to fabrication process limitations, meaning that the fin structures 204 are not aligned with the fin grids 206. In the illustrated example in FIG. 2A, the ten normal active regions 202*n* are all off-grid.

The wide active region 202*w*, on the other hand, is on-grid, meaning that the fin structures 204 of the wide active region 202*w* are aligned with the fin grids 206. For example, a fin structure 204-1 of the wide active region 202*w* is aligned with a fin grid 206-1. Other fin structure 204 of the wide active region 202*w* are also aligned with one fin grid 206, respectively.

The power gating cell 102 can achieve smaller chip area and better power conversion efficiency, which is illustrated by the comparison with the first benchmark power gating cell 292 of FIG. 2B and the second benchmark power gating cell 294 of FIG. 2C.

The first benchmark power gating cell 292 has the same active region area as that of the power gating cell 102, but with a larger chip area than that of the power gating cell 102. Different from the power gating cell 102, the active regions 202 in a central area 212' of the first benchmark power gating cell 292 within a boundary 214' are both normal active regions 202$n$. More specifically, both normal active regions 202$n$ have two fin structures 204. Since the normal active regions 202$n$ have a gap therebetween, the length X1 of the normal active regions 202$n$ is longer than the length X2 of the wide active region 202$w$ in FIG. 2A, in order to have the same active region area. As a result, the overall cell area of the first benchmark power gating cell 292 is larger than that of the power gating cell 102. As such, the power gating cell 102 can result in a smaller chip area than conventional cell layouts do, under the same active region area.

From another perspective, the second benchmark power gating cell 294 has the same overall cell area as that of the power gating cell 102, but with a smaller active region area than that of the power gating cell 102. Different from the power gating cell 102, the active regions 202 in a central area 212" of the second benchmark power gating cell 294 within a boundary 214" are both normal active regions 202$n$. More specifically, both normal active regions 202$n$ have two fin structures 204. Since the normal active regions 202$n$ have a gap therebetween, the active region area of the second benchmark power gating cell 294 is smaller than that of the wide active region 202$w$ in FIG. 2A, when the length X2 of the normal active regions 202$n$ is the same as the length X2 of the wide active region 202$w$. As a result, the larger active region area of the wide active region 202$w$ results in a smaller IR drop of the power gating cell 102.

In summary, the power gating cell 102 with the wide active region 202$w$ can achieve a smaller chip area and higher power conversion efficiency.

Figure 3:
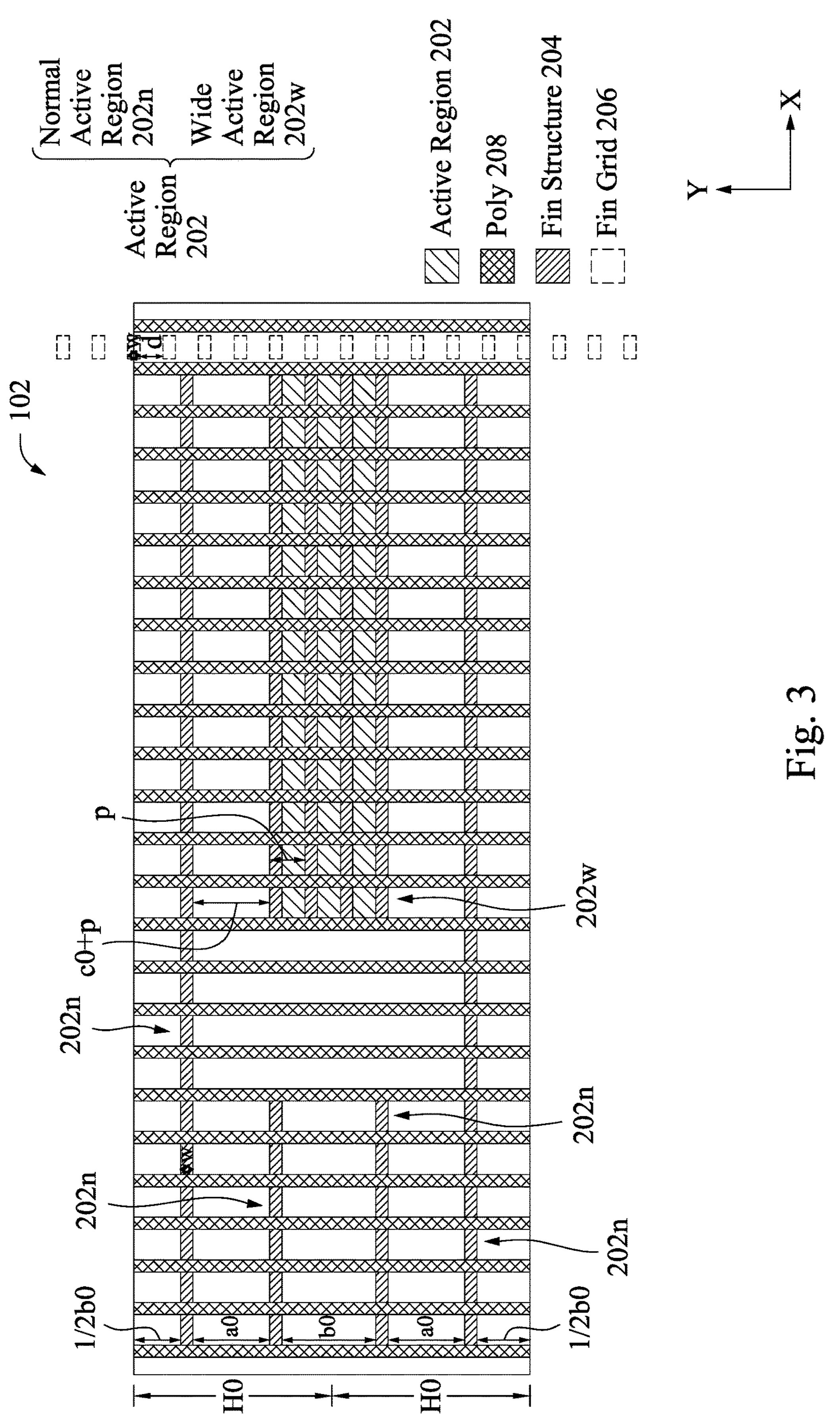
FIG. 3 is a diagram illustrating a power gating cell 102 in accordance with some embodiments.

FIG. 3 is a diagram illustrating a power gating cell 102 in accordance with some embodiments. In the illustrated example in FIG. 3, the wide active region 202$w$ has four fin structures 204, and each of four normal active regions 202$n$ has one fin structure. The normal active regions 202$n$ at the top and the bottom of the power gating cell 102 are relatively long in the X direction. H0 is a standard cell height (in the Y direction) for a one-fin-active-region cell. The cell 102 has a height of 2H0 (in the Y direction). Distances H0, a0, b0, c0 have the relationship below:

$$H0 \neq a0 \neq b0 \neq c0 \neq p \neq w,$$

where p is the fin structure pitch and w is the width of a fin structure 204.

Figure 4:
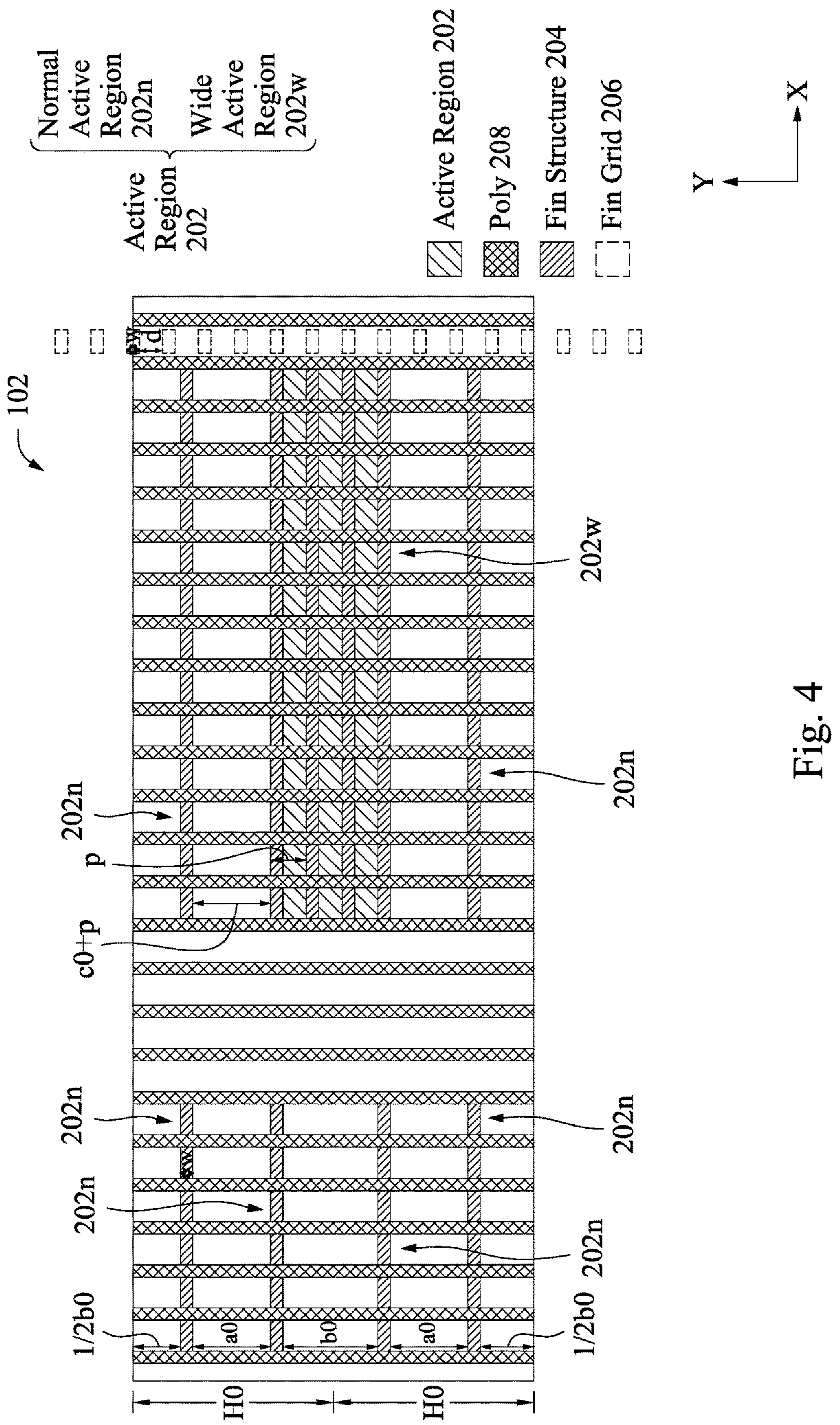
FIG. 4 is a diagram illustrating a power gating cell 102 in accordance with some embodiments.

FIG. 4 is a diagram illustrating a power gating cell 102 in accordance with some embodiments. In the illustrated example in FIG. 4, the wide active region 202$w$ has four fin structures 204, and each of six normal active regions 202$n$ has one fin structure. The normal active regions 202$n$ at the right of the power gating cell 102 are relatively long in the X direction. H0 is a standard cell height (in the Y direction) for a one-fin-active-region cell. The cell 102 has a height of 2H0 (in the Y direction). Distances H0, a0, b0, c0 have the relationship below:

$$H0 \neq a0 \neq b0 \neq c0 \neq p \neq w,$$

where p is the fin structure pitch and w is the width of a fin structure 204.

Figure 5:
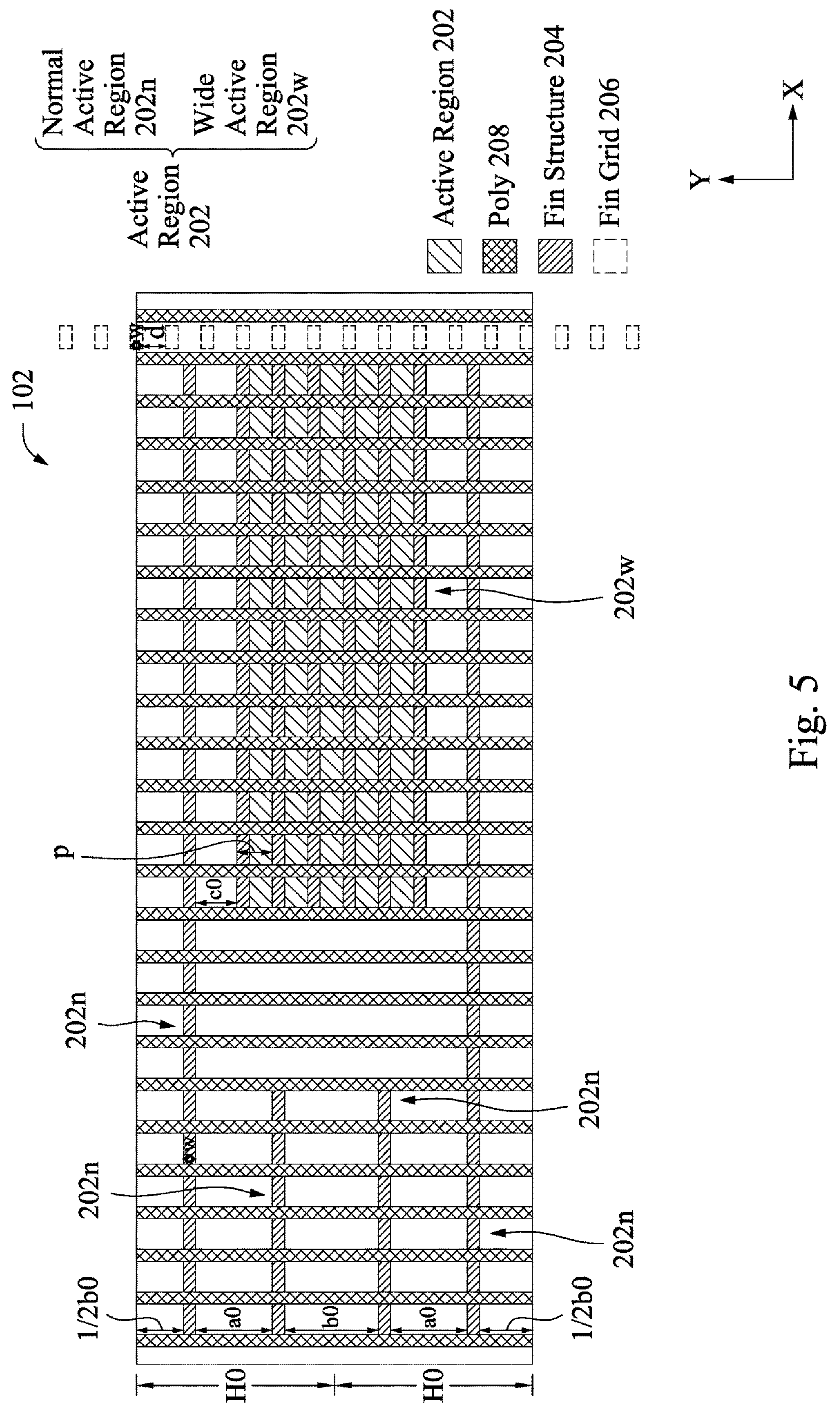
FIG. 5 is a diagram illustrating a power gating cell 102 in accordance with some embodiments.

FIG. 5 is a diagram illustrating a power gating cell 102 in accordance with some embodiments. In the illustrated example in FIG. 5, the wide active region 202$w$ has six fin structures 204, and each of four normal active regions 202$n$ has one fin structure. The normal active regions 202$n$ at the top and the bottom of the power gating cell 102 are relatively long in the X direction. H0 is a standard cell height (in the Y direction) for a one-fin-active-region cell. The cell 102 has a height of 2H0 (in the Y direction). Distances H0, a0, b0, c0 have the relationship below:

$$H0 \neq a0 \neq b0 \neq c0 \neq p \neq w,$$

where p is the fin structure pitch and w is the width of a fin structure 204.

Figure 6:
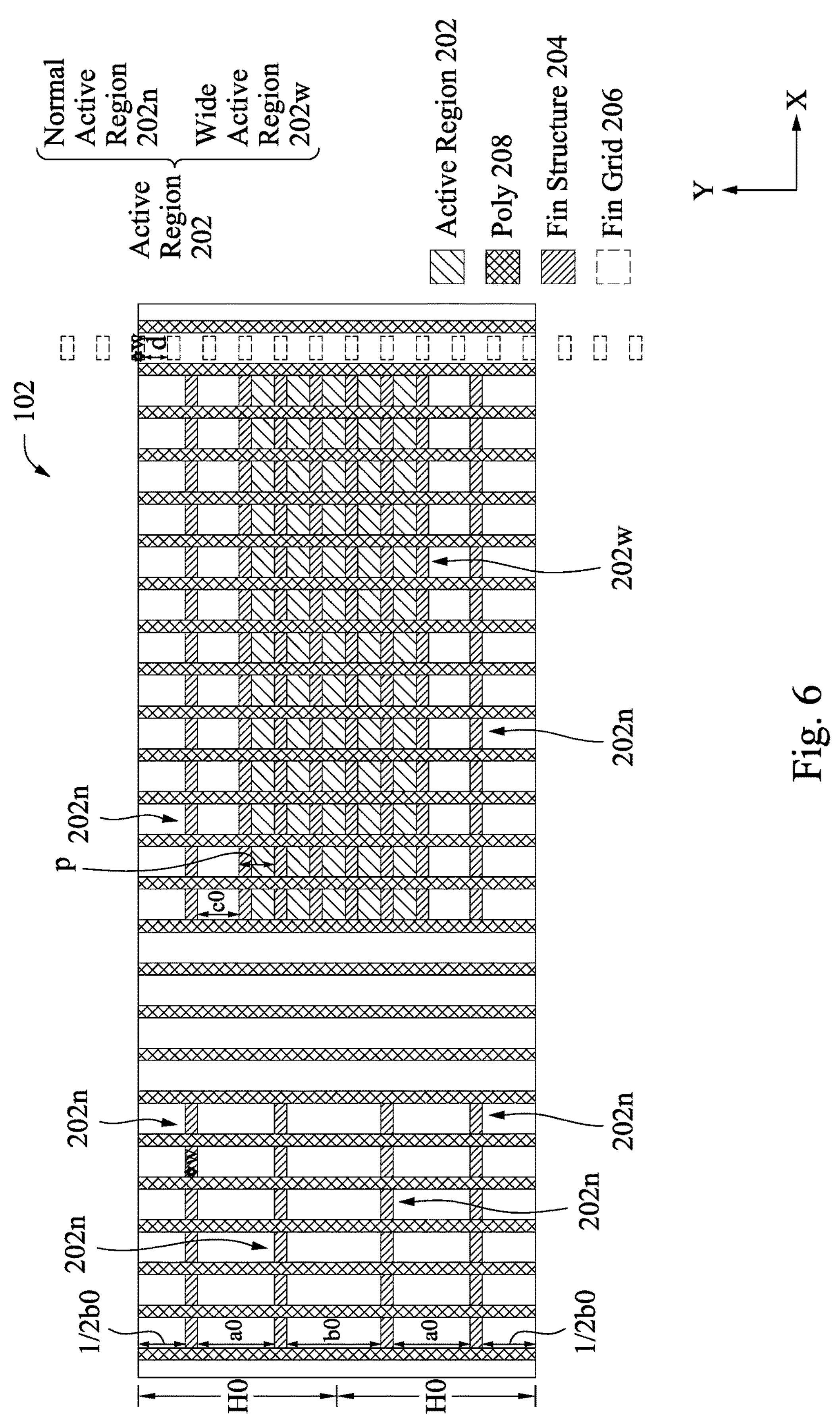
FIG. 6 is a diagram illustrating a power gating cell 102 in accordance with some embodiments.

FIG. 6 is a diagram illustrating a power gating cell 102 in accordance with some embodiments. In the illustrated example in FIG. 6, the wide active region 202$w$ has six fin structures 204, and each of six normal active regions 202$n$ has one fin structure. The normal active regions 202$n$ at the right of the power gating cell 102 are relatively long in the X direction. H0 is a standard cell height (in the Y direction) for a one-fin-active-region cell. The cell 102 has a height of 2H0 (in the Y direction). Distances H0, a0, b0, c0 have the relationship below:

$$H0 \neq a0 \neq b0 \neq c0 \neq p \neq w,$$

where p is the fin structure pitch and w is the width of a fin structure 204.

Figure 7:
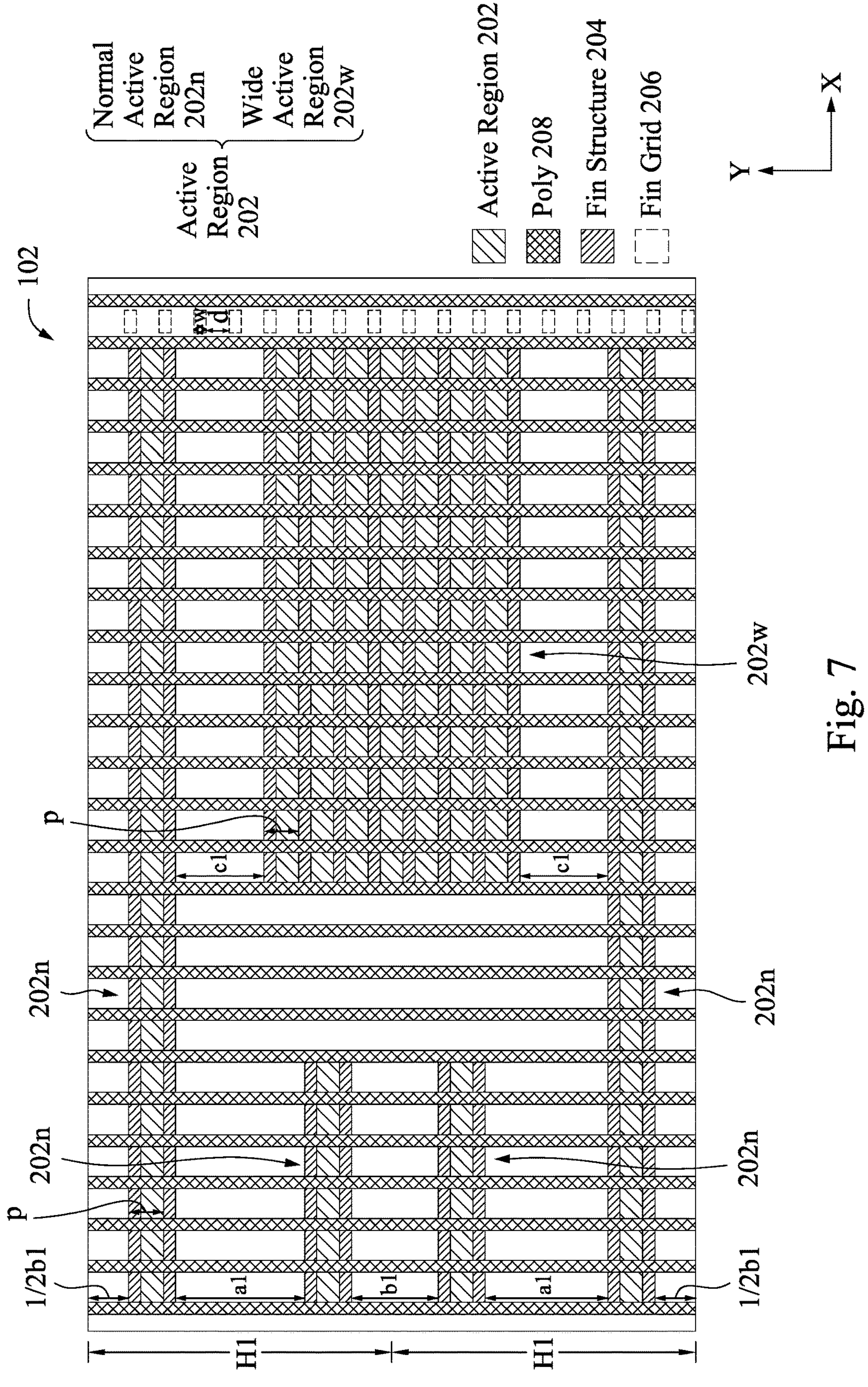
FIG. 7 is a diagram illustrating a power gating cell 102 in accordance with some embodiments.

FIG. 7 is a diagram illustrating a power gating cell 102 in accordance with some embodiments. In the illustrated example in FIG. 7, the wide active region 202$w$ has eight fin structures 204, and each of four normal active regions 202$n$ has two fin structures. The normal active regions 202$n$ at the top and the bottom of the power gating cell 102 are relatively long in the X direction. H1 is a standard cell height (in the Y direction) for a two-fin-active-region cell. The cell 102 has a height of 2H1 (in the Y direction). Distances H1, a1, b1, c1 have the relationship below:

$$H1 \neq a1 \neq b1 \neq c1 \neq p,$$

where p is the fin structure pitch.

Figure 8:
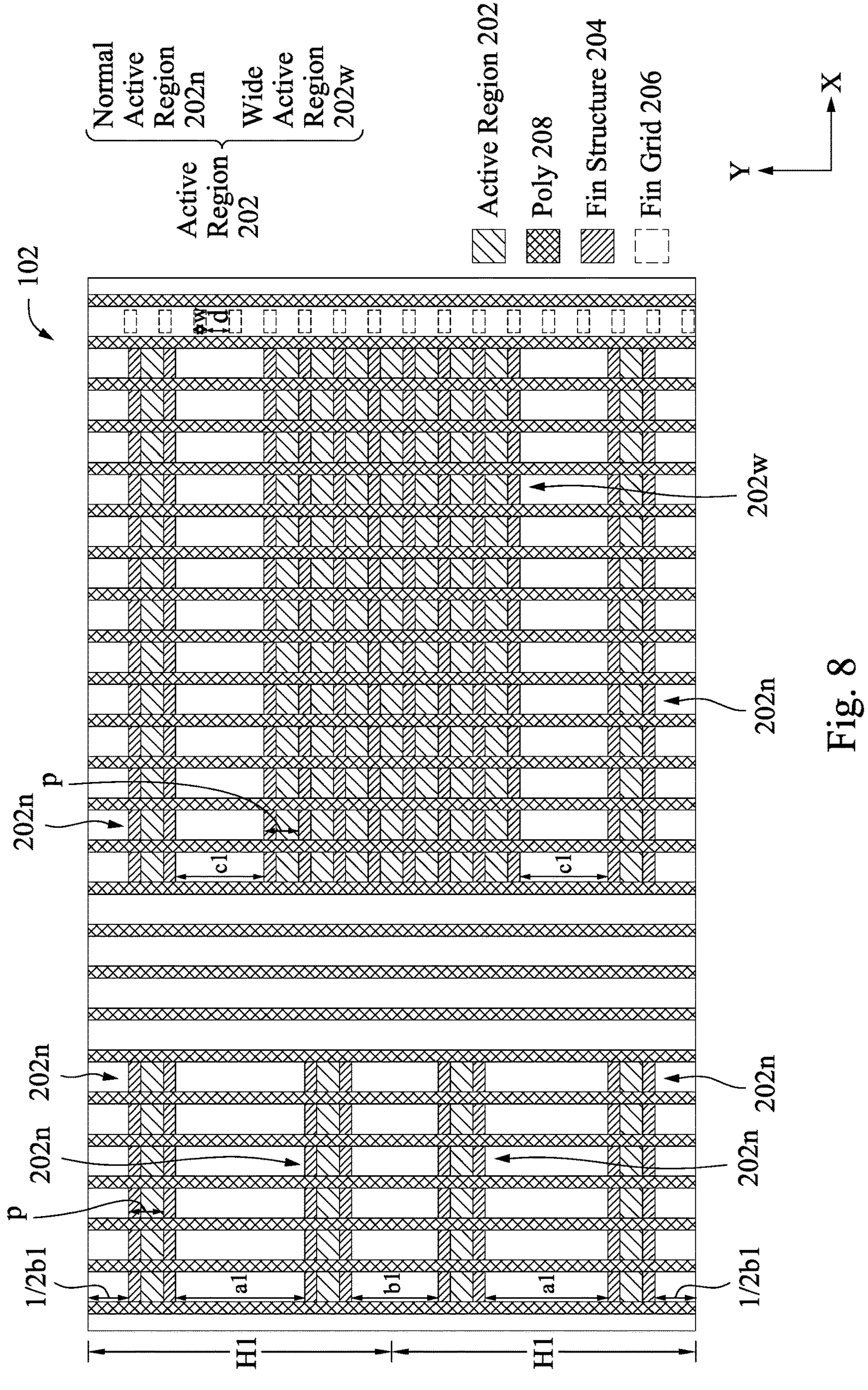
FIG. 8 is a diagram illustrating a power gating cell 102 in accordance with some embodiments.

FIG. 8 is a diagram illustrating a power gating cell 102 in accordance with some embodiments. In the illustrated example in FIG. 8, the wide active region 202$w$ has eight fin structures 204, and each of six normal active regions 202$n$ has two fin structures. The normal active regions 202$n$ at the right of the power gating cell 102 are relatively long in the X direction. H1 is a standard cell height (in the Y direction) for a two-fin-active-region cell. The cell 102 has a height of 2H1 (in the Y direction). Distances H1, a1, b1, c1 have the relationship below:

$$H1 \neq a1 \neq b1 \neq c1 \neq p,$$

where p is the fin structure pitch.

Figure 9:
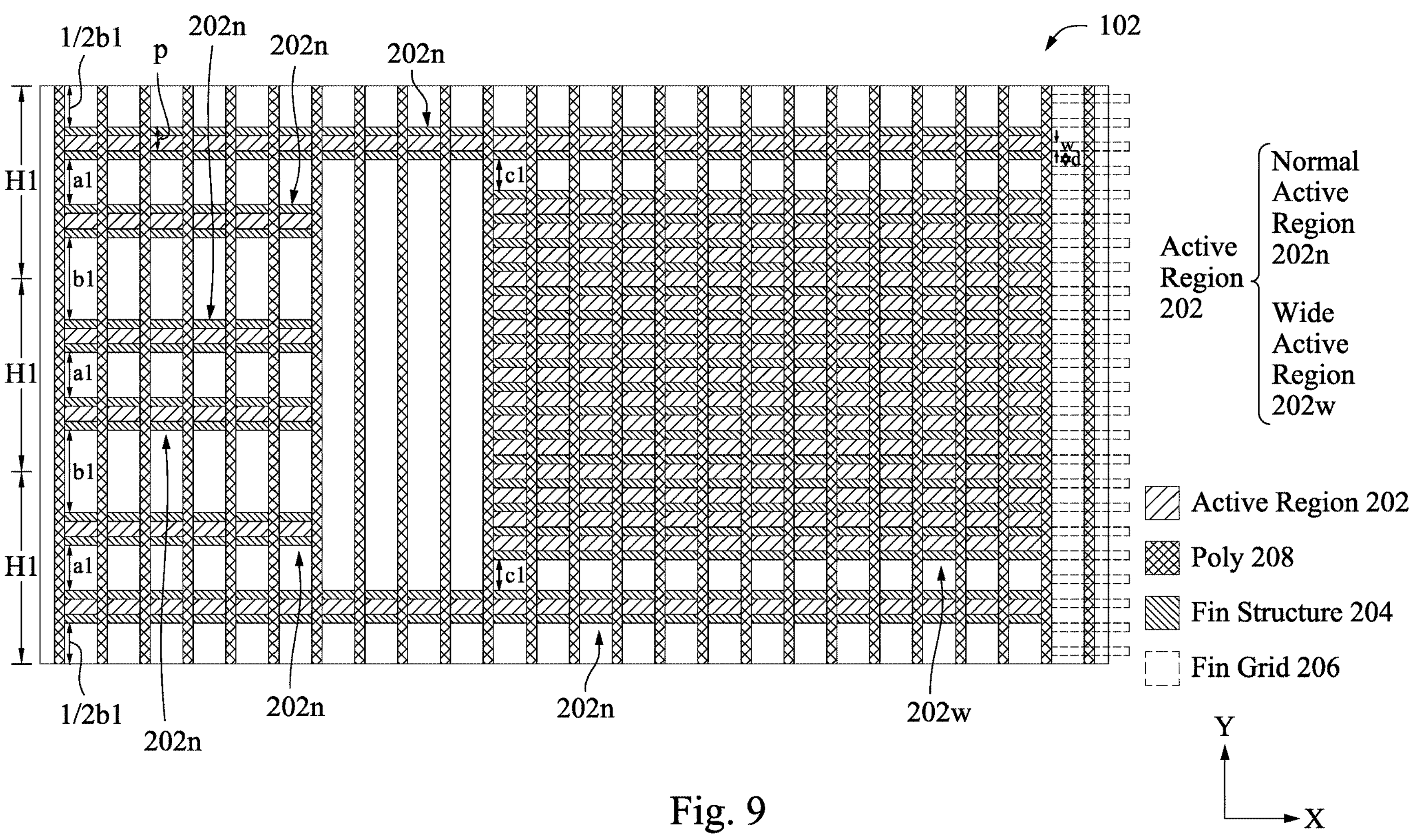
FIG. 9 is a diagram illustrating a power gating cell 102 in accordance with some embodiments.

FIG. 9 is a diagram illustrating a power gating cell 102 in accordance with some embodiments. In the illustrated example in FIG. 9, the wide active region 202$w$ has sixteen fin structures 204, and each of six normal active regions 202$n$ has two fin structures. The normal active regions 202$n$ at the top and the bottom of the power gating cell 102 are relatively long in the X direction. H1 is a standard cell height (in the Y direction) for a two-fin-active-region cell. The cell 102 has a height of 3H1 (in the Y direction). Distances H1, a1, b1, c1 have the relationship below:

$$H1 \neq a1 \neq b1 \neq c1 \neq p,$$

where p is the fin structure pitch.

Figure 10:
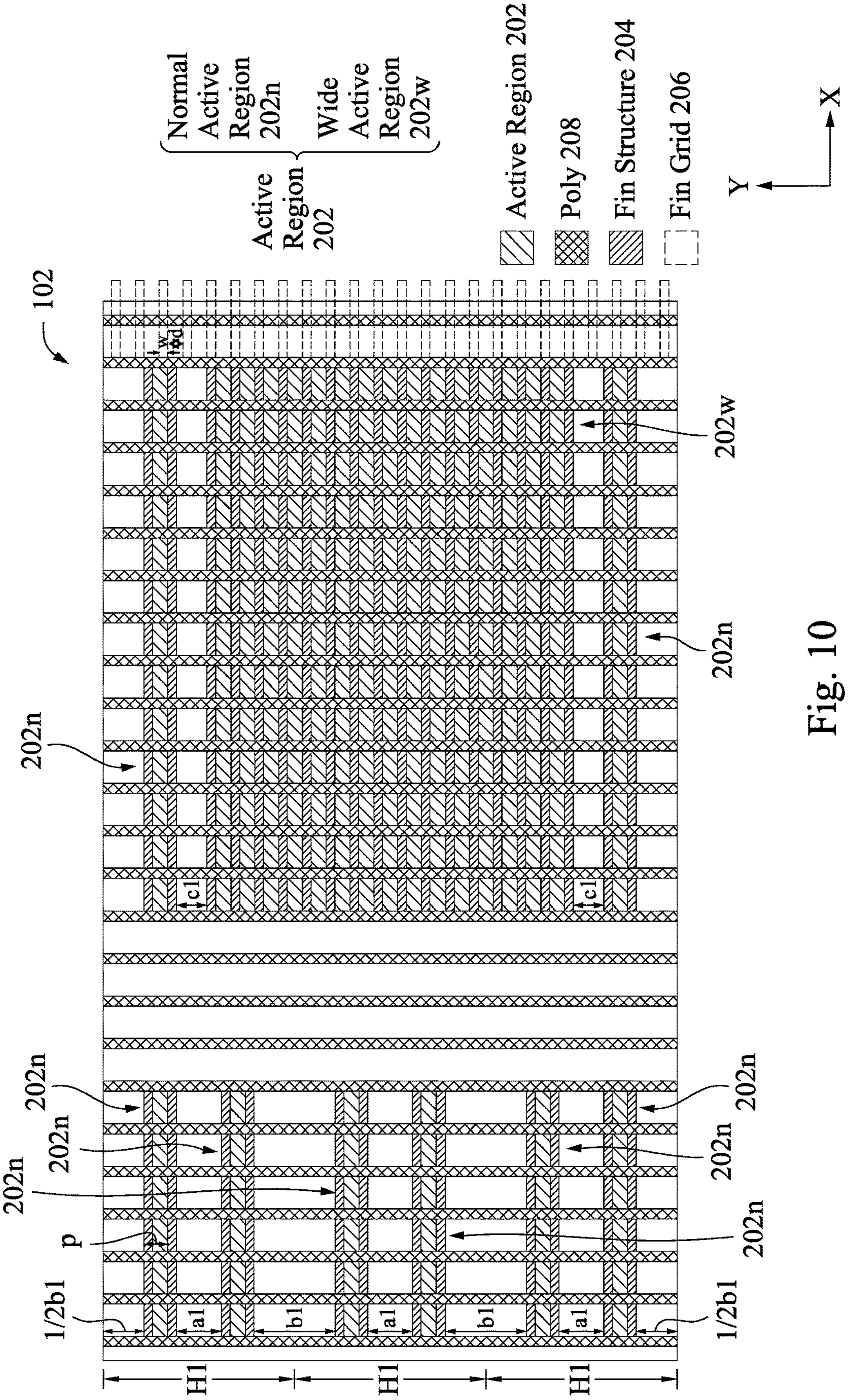
FIG. 10 is a diagram illustrating a power gating cell 102 in accordance with some embodiments.

FIG. 10 is a diagram illustrating a power gating cell 102 in accordance with some embodiments. In the illustrated example in FIG. 10, the wide active region 202$w$ has sixteen fin structures 204, and each of eight normal active regions 202$n$ has two fin structures. The normal active regions 202$n$ at the right of the power gating cell 102 are relatively long in the X direction. H1 is a standard cell height (in the Y direction) for a two-fin-active-region cell. The cell 102 has a height of 3H1 (in the Y direction). Distances H1, a1, b1, c1 have the relationship below:

$$H1 \neq a1 \neq b1 \neq c1 \neq p,$$

where p is the fin structure pitch.

Figure 11:
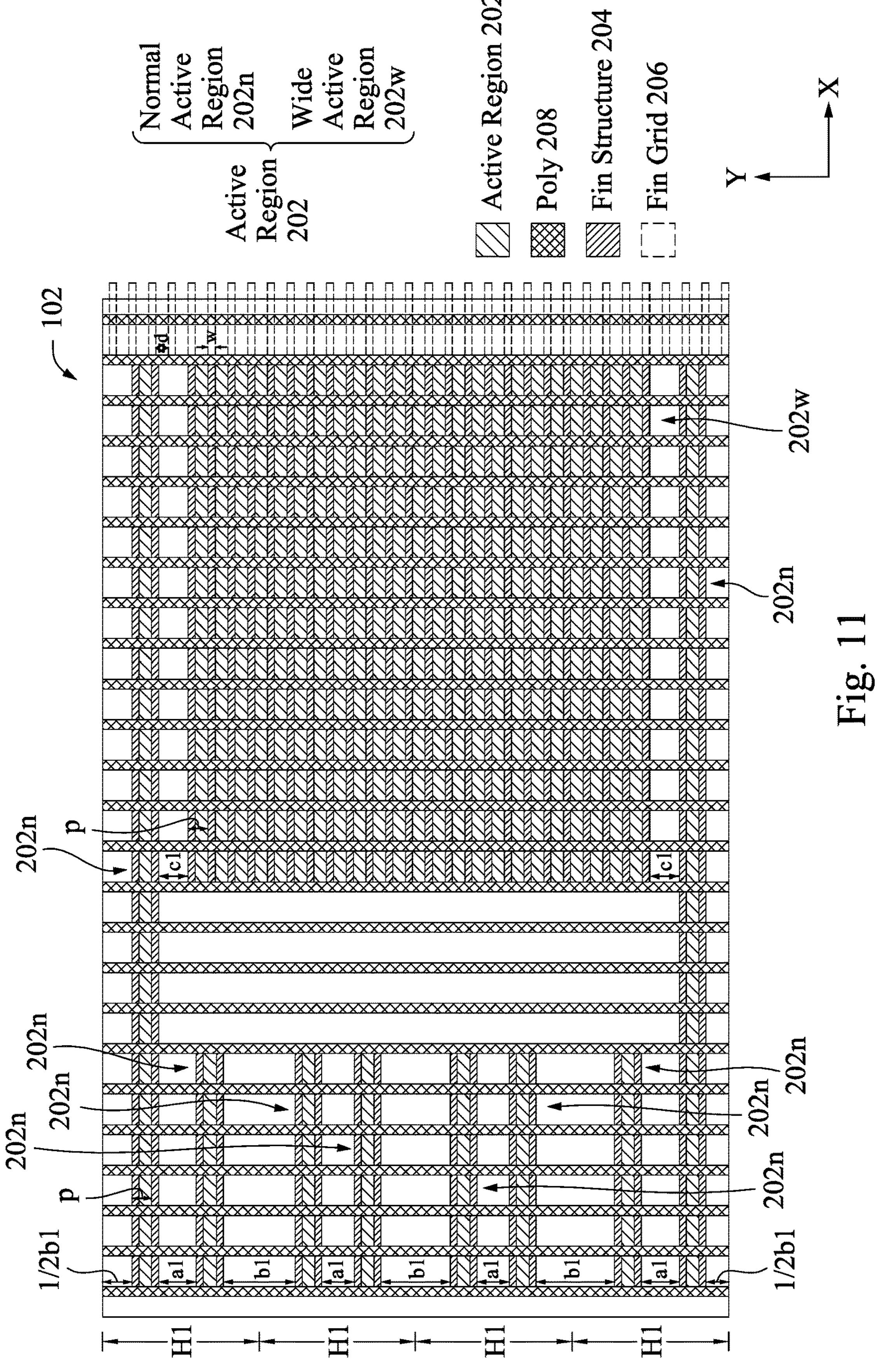
FIG. 11 is a diagram illustrating a power gating cell 102 in accordance with some embodiments.

FIG. 11 is a diagram illustrating a power gating cell 102 in accordance with some embodiments. In the illustrated example in FIG. 11, the wide active region 202*w* has twenty-four fin structures 204, and each of eight normal active regions 202*n* has two fin structures. The normal active regions 202*n* at the top and the bottom of the power gating cell 102 are relatively long in the X direction. H1 is a standard cell height (in the Y direction) for a two-fin-active-region cell. The cell 102 has a height of 4H1 (in the Y direction). Distances H1, a1, b1, c1 have the relationship below:

$$H1 \neq a1 \neq b1 \neq c1 \neq p,$$

where p is the fin structure pitch.

Figure 12:
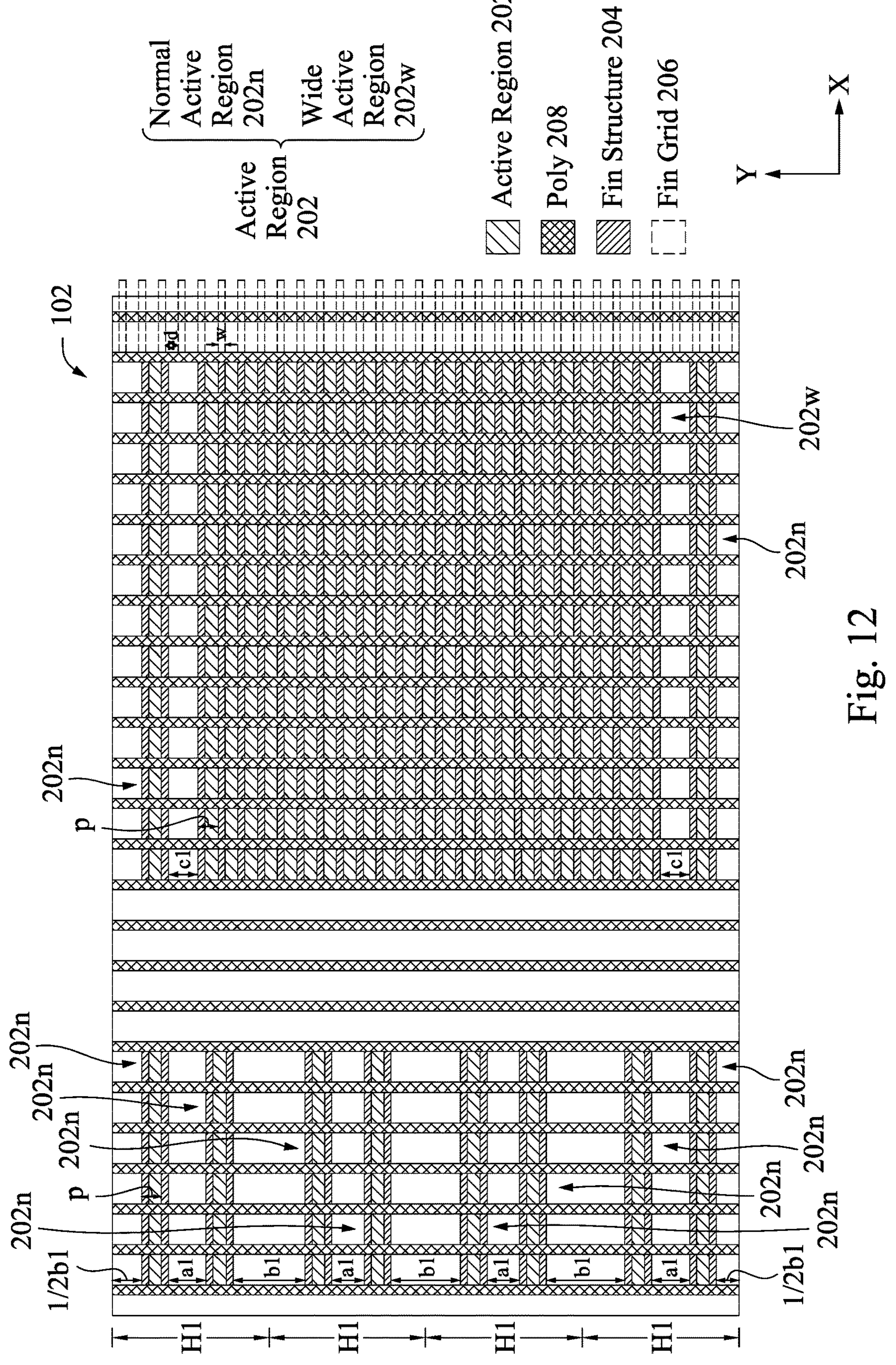
FIG. 12 is a diagram illustrating a power gating cell 102 in accordance with some embodiments.

FIG. 12 is a diagram illustrating a power gating cell 102 in accordance with some embodiments. In the illustrated example in FIG. 12, the wide active region 202*w* has twenty-four fin structures 204, and each of ten normal active regions 202*n* has two fin structures. The normal active regions 202*n* at the right of the power gating cell 102 are relatively long in the X direction. H1 is a standard cell height (in the Y direction) for a two-fin-active-region cell. The cell 102 has a height of 4H1 (in the Y direction). Distances H1, a1, b1, c1 have the relationship below:

$$H1 \neq a1 \neq b1 \neq c1 \neq p,$$

where p is the fin structure pitch.

Figure 13:
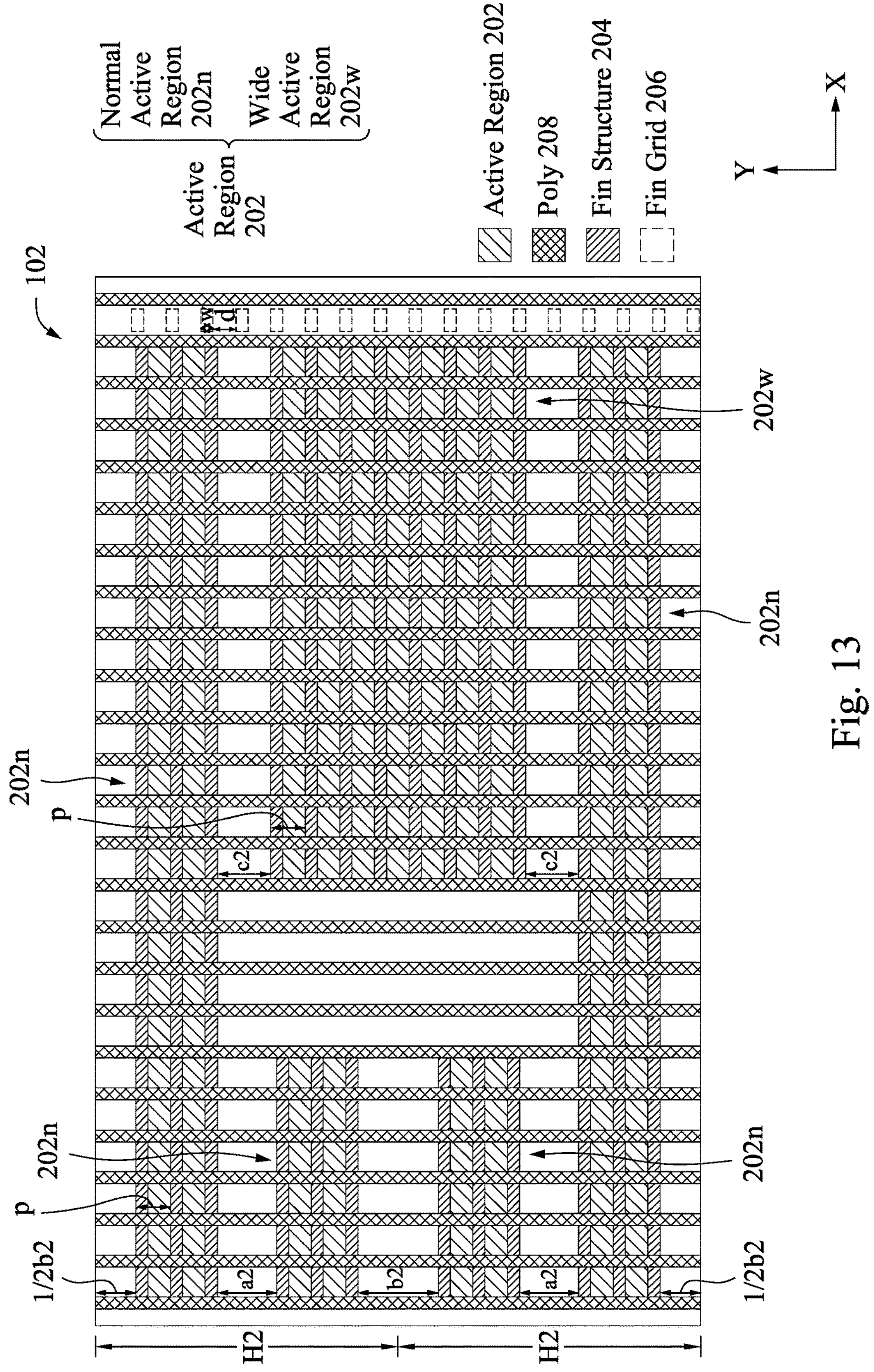
FIG. 13 is a diagram illustrating a power gating cell 102 in accordance with some embodiments.

FIG. 13 is a diagram illustrating a power gating cell 102 in accordance with some embodiments. In the illustrated example in FIG. 13, the wide active region 202*w* has eight fin structures 204, and each of four normal active regions 202*n* has three fin structures. The normal active regions 202*n* at the top and the bottom of the power gating cell 102 are relatively long in the X direction. H2 is a standard cell height (in the Y direction) for a three-fin-active-region cell. The cell 102 has a height of 2H2 (in the Y direction). Distances H2, a2, b2, c2 have the relationship below:

$$H2 \neq a2 \neq b2 \neq c2 \neq p,$$

where p is the fin structure pitch.

Figure 14:
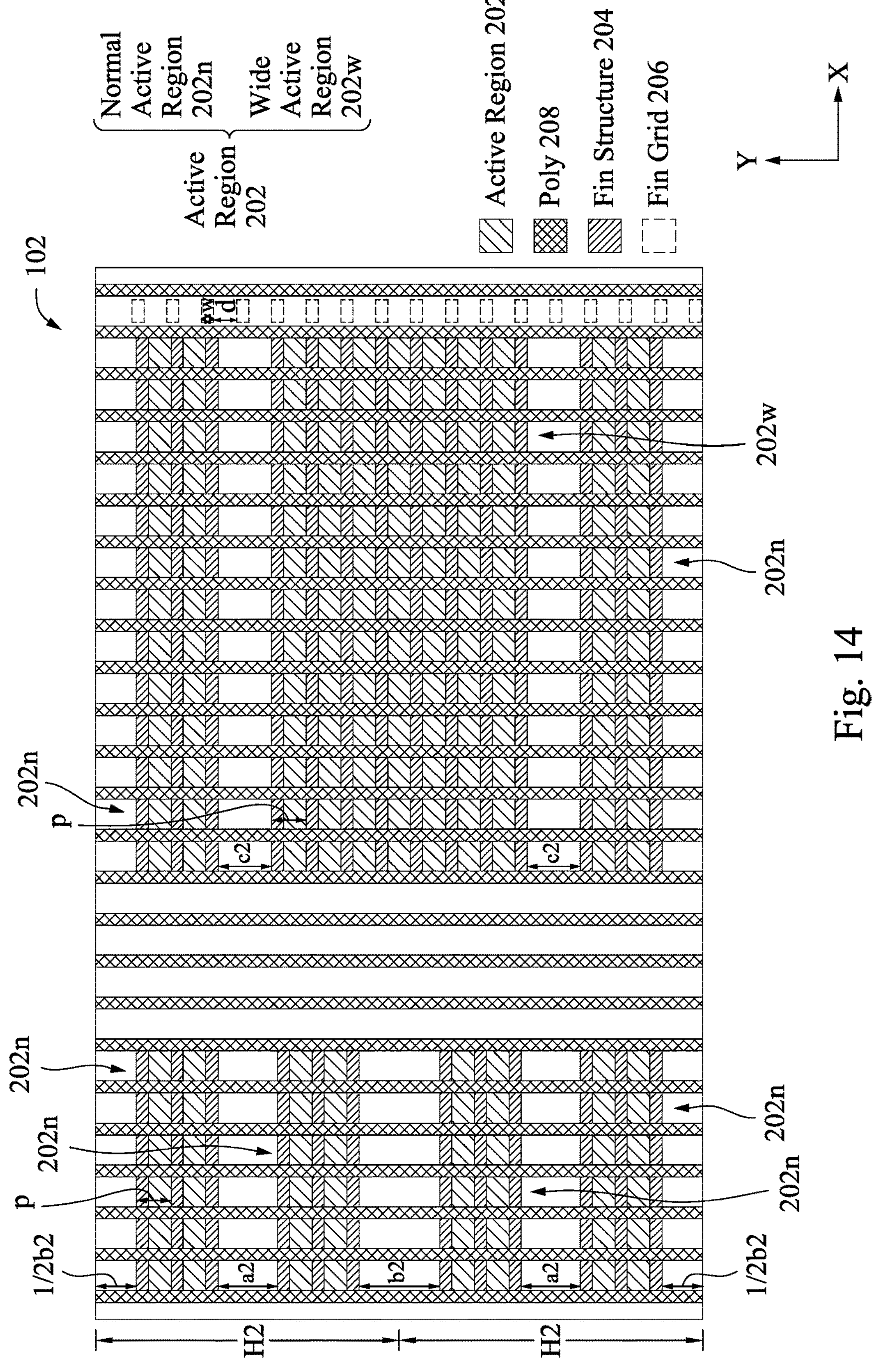
FIG. 14 is a diagram illustrating a power gating cell 102 in accordance with some embodiments.

FIG. 14 is a diagram illustrating a power gating cell 102 in accordance with some embodiments. In the illustrated example in FIG. 14, the wide active region 202*w* has eight fin structures 204, and each of six normal active regions 202*n* has three fin structures. The normal active regions 202*n* at the right of the power gating cell 102 are relatively long in the X direction. H2 is a standard cell height (in the Y direction) for a three-fin-active-region cell. The cell 102 has a height of 2H2 (in the Y direction). Distances H2, a2, b2, c2 have the relationship below:

$$H2 \neq a2 \neq b2 \neq c2 \neq p,$$

where p is the fin structure pitch.

Figure 15:
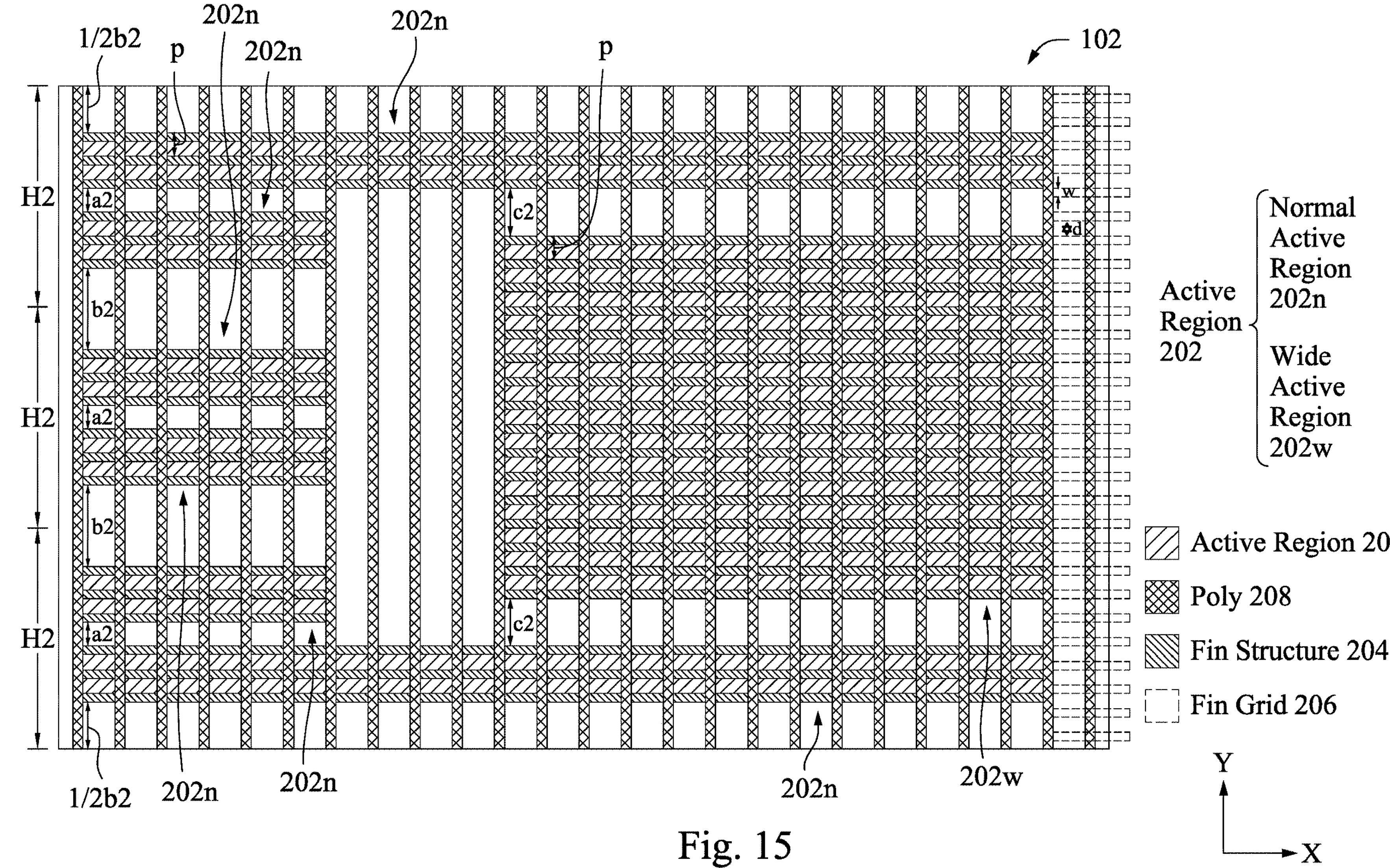
FIG. 15 is a diagram illustrating a power gating cell 102 in accordance with some embodiments.

FIG. 15 is a diagram illustrating a power gating cell 102 in accordance with some embodiments. In the illustrated example in FIG. 15, the wide active region 202*w* has sixteen fin structures 204, and each of six normal active regions 202*n* has three fin structures. The normal active regions 202*n* at the top and the bottom of the power gating cell 102 are relatively long in the X direction. H2 is a standard cell height (in the Y direction) for a three-fin-active-region cell. The cell 102 has a height of 3H2 (in the Y direction). Distances H2, a2, b2, c2 have the relationship below:

$$H2 \neq a2 \neq b2 \neq c2 \neq p,$$

where p is the fin structure pitch.

Figure 16:
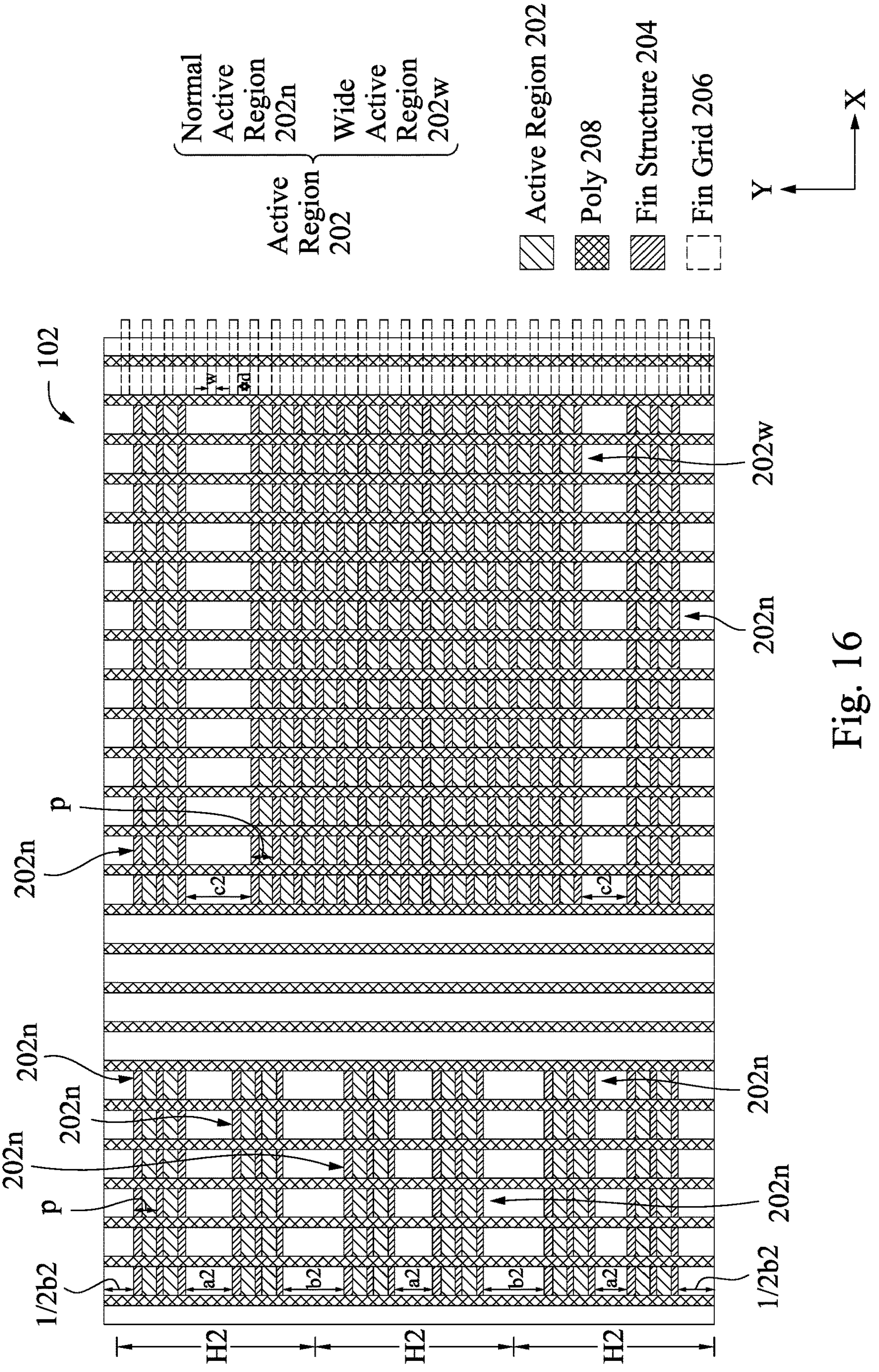
FIG. 16 is a diagram illustrating a power gating cell 102 in accordance with some embodiments.

FIG. 16 is a diagram illustrating a power gating cell 102 in accordance with some embodiments. In the illustrated example in FIG. 16, the wide active region 202*w* has sixteen fin structures 204, and each of eight normal active regions 202*n* has three fin structures. The normal active regions 202*n* at the right of the power gating cell 102 are relatively long in the X direction. H2 is a standard cell height (in the Y direction) for a three-fin-active-region cell. The cell 102 has a height of 3H2 (in the Y direction). Distances H2, a2, b2, c2 have the relationship below:

$$H2 \neq a2 \neq b2 \neq c2 \neq p,$$

where p is the fin structure pitch.

Figure 17:
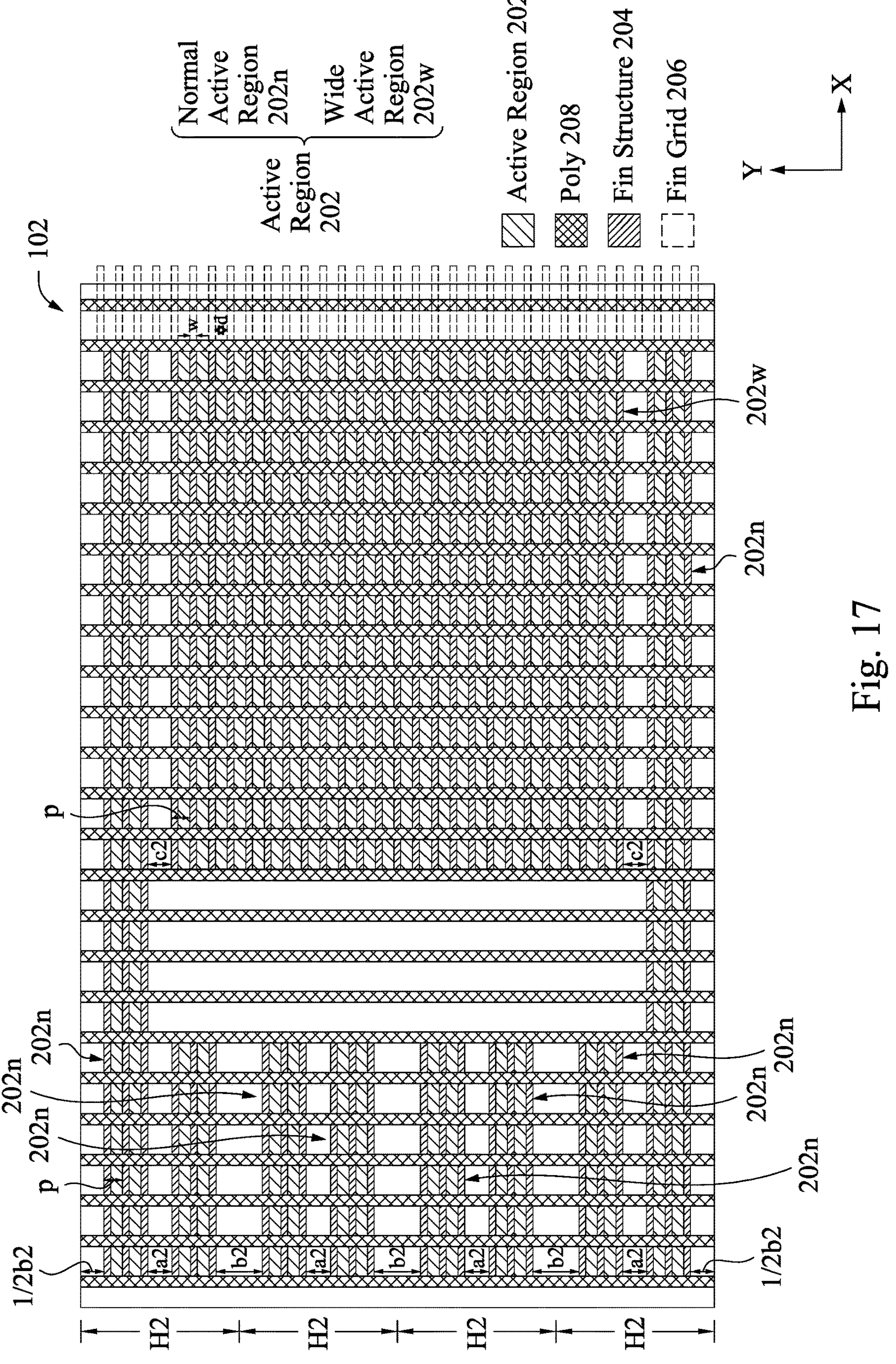
FIG. 17 is a diagram illustrating a power gating cell 102 in accordance with some embodiments.

FIG. 17 is a diagram illustrating a power gating cell 102 in accordance with some embodiments. In the illustrated example in FIG. 17, the wide active region 202*w* has twenty-four fin structures 204, and each of eight normal active regions 202*n* has three fin structures. The normal active regions 202*n* at the top and the bottom of the power gating cell 102 are relatively long in the X direction. H2 is a standard cell height (in the Y direction) for a three-fin-active-region cell. The cell 102 has a height of 4H2 (in the Y direction). Distances H2, a2, b2, c2 have the relationship below:

$$H2 \neq a2 \neq b2 \neq c2 \neq p,$$

where p is the fin structure pitch.

Figure 18:
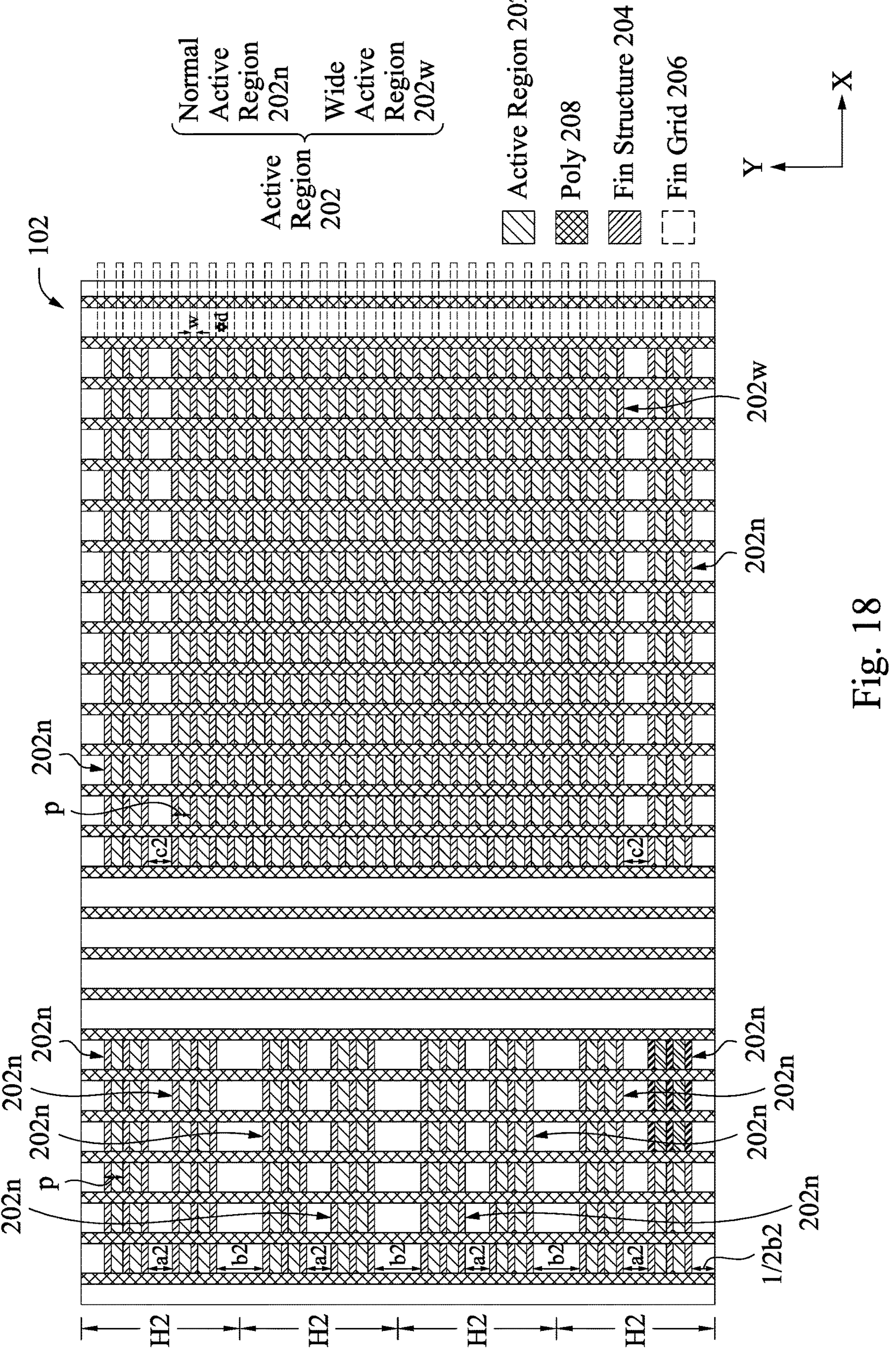
FIG. 18 is a diagram illustrating a power gating cell 102 in accordance with some embodiments.

FIG. 18 is a diagram illustrating a power gating cell 102 in accordance with some embodiments. In the illustrated example in FIG. 18, the wide active region 202*w* has twenty-four fin structures 204, and each of ten normal active regions 202*n* has three fin structures. The normal active regions 202*n* at the right of the power gating cell 102 are relatively long in the X direction. H2 is a standard cell height (in the Y direction) for a three-fin-active-region cell. The cell 102 has a height of 4H2 (in the Y direction). Distances H2, a2, b2, c2 have the relationship below:

$$H2 \neq a2 \neq b2 \neq c2 \neq p,$$

where p is the fin structure pitch.

Figure 19:
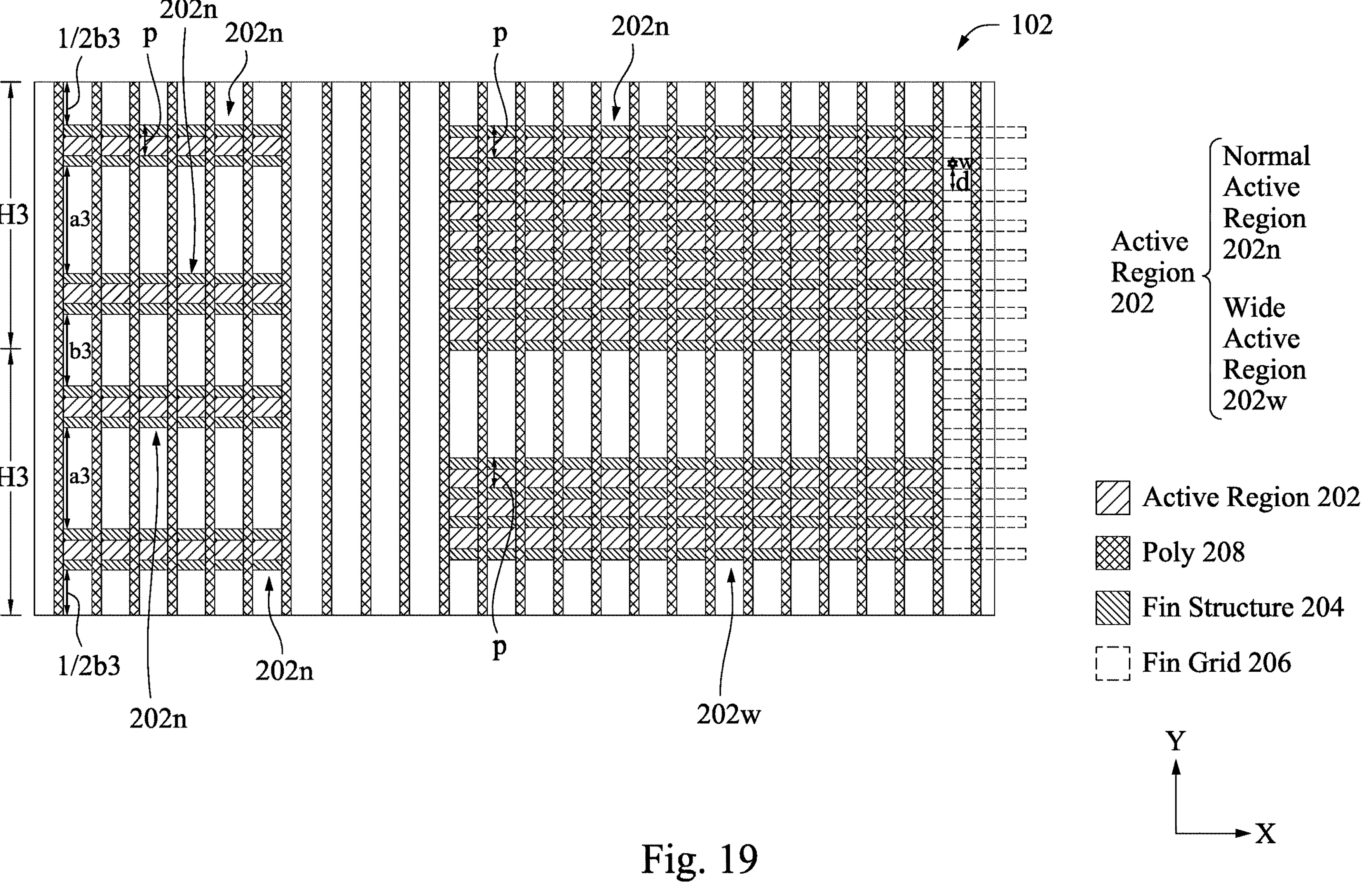
FIG. 19 is a diagram illustrating a power gating cell 102 in accordance with some embodiments.

FIG. 19 is a diagram illustrating a power gating cell 102 in accordance with some embodiments. In the illustrated example in FIG. 19, there are two wide active region 202*w* (one of them has eight fin structures 204 and the other of them has four fin structures 204), and each of four normal active regions 202*n* has two fin structures. In this example, H3 is a standard cell height (in the Y direction) for a two-fin-active-region cell. The cell 102 has a height of 2H3 (in the Y direction). Distances H3, a3, and b3 have the relationship below:

$$H3 \neq a3 \neq b3 \neq p,$$

where p is the fin structure pitch.

Figure 20:
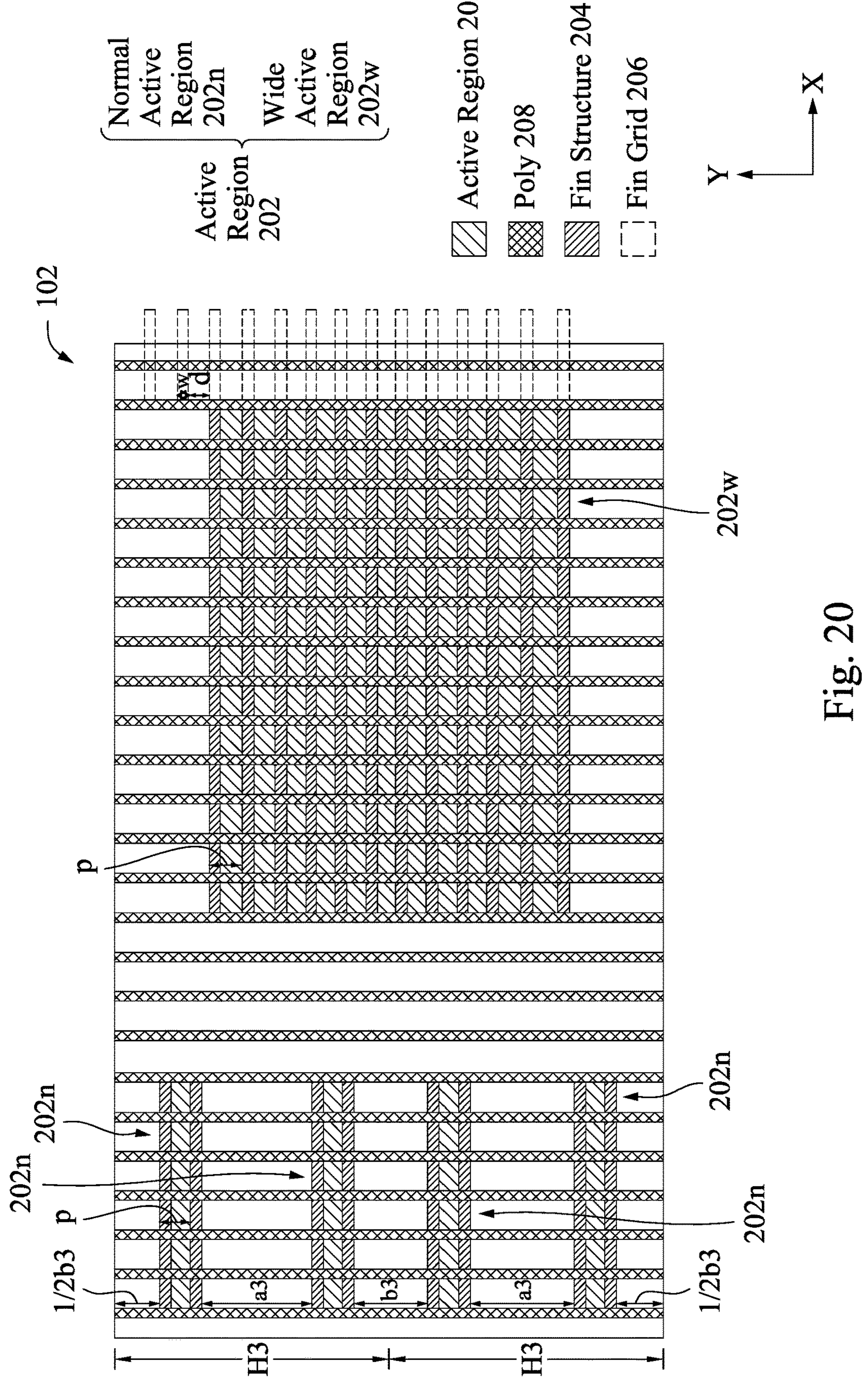
FIG. 20 is a diagram illustrating a power gating cell 102 in accordance with some embodiments.

FIG. 20 is a diagram illustrating a power gating cell 102 in accordance with some embodiments. In the illustrated example in FIG. 20, the wide active region 202*w* has twelve fin structures 204, and each of four normal active regions 202*n* has two fin structures. No normal active region 202*n* is located adjacent of the long sides in the X direction of the wide active region 202*w*. In this example, H3 is a standard cell height (in the Y direction) for a two-fin-active-region cell. The cell 102 has a height of 2H3 (in the Y direction). Distances H3, a3, and b3 have the relationship below:

$$H3 \neq a3 \neq b3 \neq p,$$

where p is the fin structure pitch.

Figure 21:
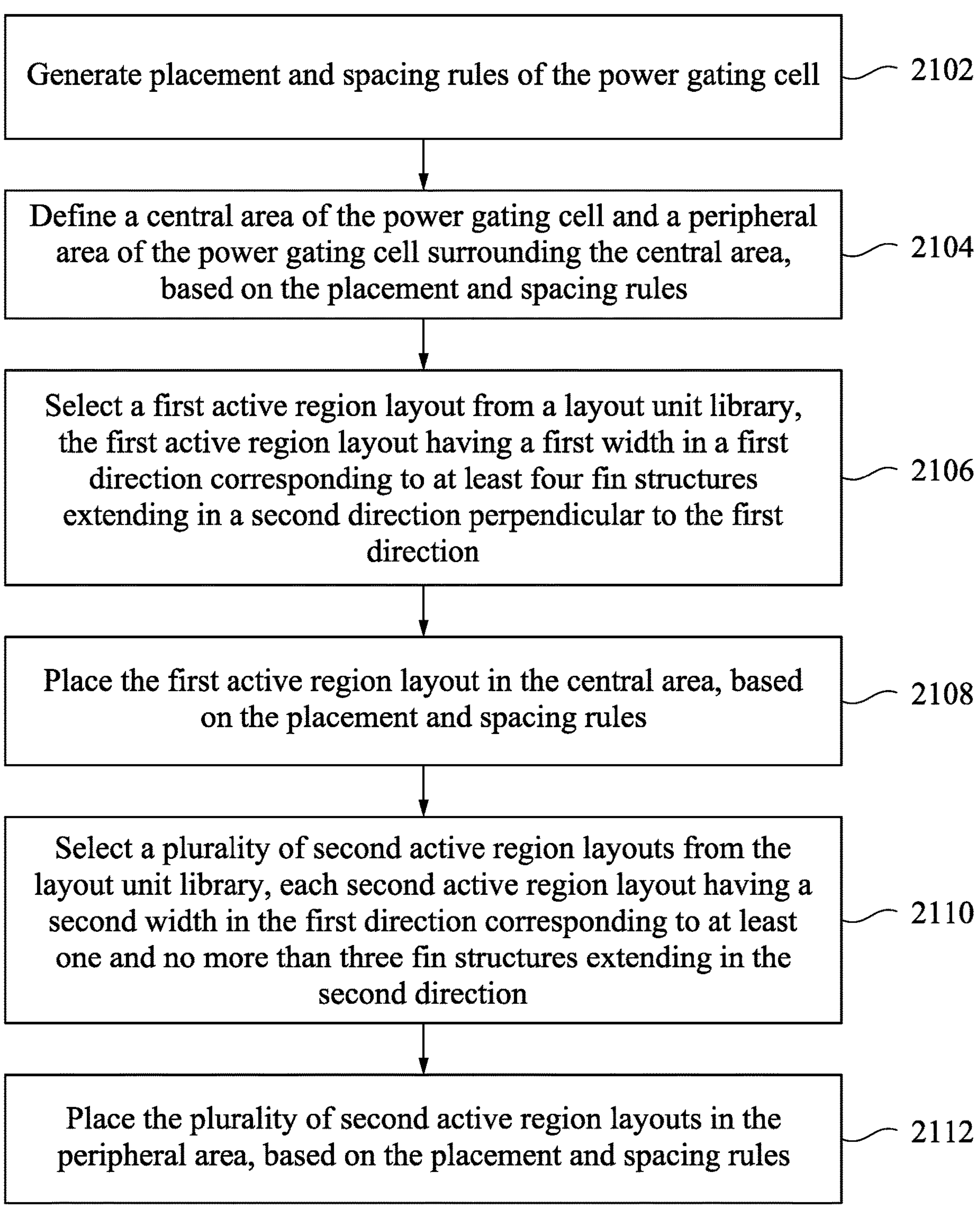
FIG. 21 is flowchart diagram illustrating a method of generating a power gating cell layout in accordance with some embodiments.
Figure 22:
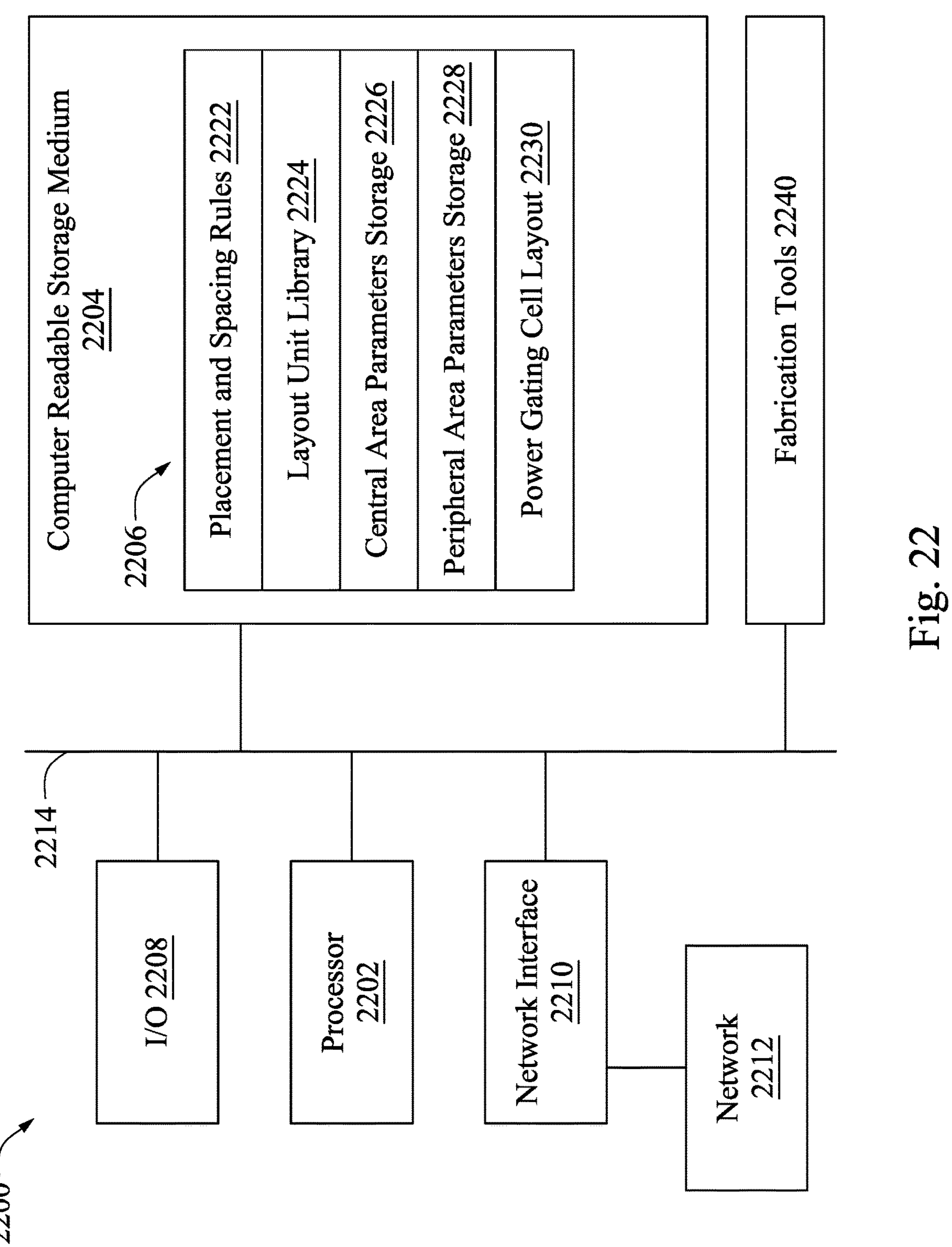
FIG. 22 is a block diagram of a system for implementing the method of FIG. 21, in accordance with some embodiments.

FIG. 21 is flowchart diagram illustrating a method of generating a power gating cell layout in accordance with some embodiments. FIG. 22 is a block diagram of a system 2200 for implementing the method of FIG. 21, in accordance with some embodiments.

Referring to FIG. 21, at step 2102, placement and spacing rules of the power gating cell are generated. The placement and spacing rules are a set of rules regarding spacing and placement of that must be following when generating a layout. For example, the relationship that H3≠a3≠b3≠p, as shown in FIG. 20, is one placement and spacing rule. In some embodiments, the placement and spacing rules are performed for each new layout unit (e.g., a layout for one of the normal active regions 202*n* as shown in FIG. 2A). At step 2104, a central area (e.g., the central area 212 as shown in FIG. 2A) of the power gating cell and a peripheral area (e.g., the peripheral area 216 as shown in FIG. 2A) of the power gating cell surrounding the central area are defined, based on the placement and spacing rules. Specifically, a boundary line (e.g., the boundary line 214 as shown in FIG. 2A) is defined, and parameters of the central area and the peripheral area are stored. The placement and spacing rules are satisfied at step 2104. For example, the peripheral area on the top of the central area cannot be too narrow to accommodate a normal active region. At step 2106, a first active region layout is selected from a layout unit library. The first active region layout is a layout for a wide active region (e.g., the wide active region 202*w* as shown in FIG. 2A). The layout unit library includes various layout units such as both layouts for normal active regions and layouts for wide active regions. Those layout units are used to build up a layout as needed. At step 2108, the first active region layout selected at step 2106 is placed in the central area defined at step 2104, based on the placement and spacing rules. At step 2110, a plurality of active region layouts are selected from the layout unit library. The second active region layouts are layouts for normal active regions (e.g., the normal active region 202*n* as shown in FIG. 2A). At step 2112, the second active region layouts selected at step 2110 are placed in the peripheral area defined at step 2104, based on the placement and spacing rules. As such, a layout for a power gating cell (e.g., the power gating cell 102 as shown in FIG. 2A) is generated.

Referring to FIG. 22, the system 2200 is usable for implementing the method of FIG. 21. The system 2200 includes a processor 2202 and a non-transitory, computer readable storage medium 2204 encoded with, i.e., storing, the computer program code 2206, i.e., a set of executable instructions. The processor 2202 is electrically coupled to the computer readable storage medium 2204 via a bus 2214. The processor 2202 is configured to execute the computer program code 2206 encoded in the computer readable storage medium 2204 in order to cause system 2200 to be usable for performing a portion or all of the operations as depicted in FIG. 21. In some embodiments, the processor 2202 is a central processing unit (CPU), a multi-processor, a distributed processing system, an application specific integrated circuit (ASIC), and/or a suitable processing unit. In some embodiments, the computer readable storage medium 2204 is an electronic, magnetic, optical, electromagnetic, infrared, and/or a semiconductor system (or apparatus or device). For example, the computer readable storage medium 2204 may be a semiconductor or solid-state memory, a magnetic tape, a removable computer diskette, a random access memory (RAM), a read-only memory (ROM), a rigid magnetic disk, and/or an optical disk, though other types of computer readable storage medium may also be employed.

The computer readable storage medium 2204 stores, among other things, placement and spacing rules 2222, a layout unit library 2224, a central area parameters storage 2226, a peripheral area parameters storage 2228, and a power gating cell layout 2230, which are needed for performing the method of FIG. 21 or generated during performing the method of FIG. 21. It should be noted, the computer readable storage medium 2204 may store other information as needed. The placement and spacing rules 2222 are a set of rules regarding spacing and placement of that must be following when generating a layout as mentioned above. The layout unit library 2224 stores various layout units that are used to build up a layout as needed. The central area parameters storage 2226 stores parameters (e.g., dimensional sizes, number of wide active regions in the central area) regarding the central area defined at step 2104 as mentioned above. The peripheral area parameters storage 2228 stores parameters (e.g., dimensional sizes, number of normal active regions in the peripheral area) regarding the peripheral area defined at step 2104 as mentioned above. The power gating cell layout 2230 is the layout generated by performing the method of FIG. 21. The power gating cell layout 2230 is stored in the computer readable storage medium 2204. The power gating cell layout 2230 may later be used to be placed beside a standard logic cell to cut off power supplies to the standard logic cell in a standby mode or a sleep mode to save power consumption of the chip.

The system 2200 further includes an input/output (I/O) interface 2208 and a network interface 2210. The system 2200 is coupled to external circuitry via the I/O interface 2208. The network interface 2210 is coupled to the processor 2202. The network interface 2210 allows system 2200 to communicate with a network 2212, to which one or more other computer systems are connected. Network interface 2210 may be wireless network interfaces such as BLUETOOTH, WIFI, WIMAX, GPRS, or WCDMA; or wired network interface such as ETHERNET, USB, or IEEE-1394.

The system 2200 may further include fabrication tools 2240 for implementing the processes and/or methods stored in the storage medium 2204. For instance, a synthesis may be performed on a design in which the behavior and/or functions desired from the design are transformed to a functionally equivalent logic gate-level circuit description by matching the design to standard cells selected from the layout unit library 2224. The synthesis results in a functionally equivalent logic gate-level circuit description, such as a gate-level netlist. Based on the gate-level netlist, a photolithographic mask may be generated that is used to fabricate the integrated circuit by the fabrication tools 2240. Further aspects of device fabrication are disclosed in conjunction with FIG. 24, which is a block diagram of IC manufacturing system 2400, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using the manufacturing system 2400.

Figure 23:
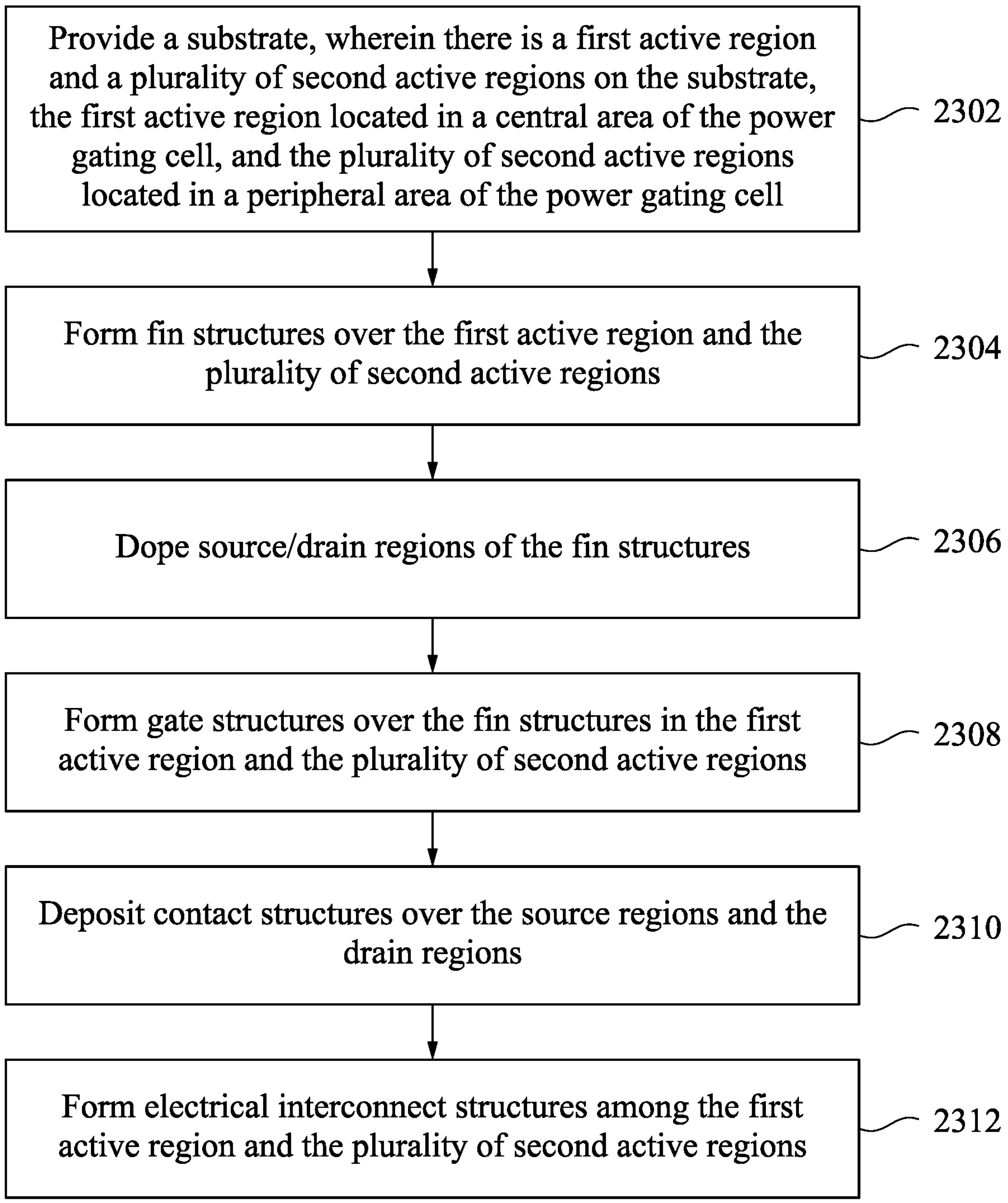
FIG. 23 is a flowchart diagram illustrating a method of fabricating a power gating cell in accordance with some embodiments.

FIG. 23 is a flowchart diagram illustrating a method of fabricating a power gating cell in accordance with some embodiments. As shown in FIG. 23, at step 2302, a substrate (e.g., the substrate 190 as shown in FIG. 2A) is provided. There is a first active region and a plurality of second active regions on the substrate. The first active region is located in a central area of the power gating cell. The plurality of second active regions are located in a peripheral area of the power gating cell surrounding the central area. The first active region has a first width in a first direction corresponding to at least four fin structures extending in a second direction perpendicular to the first direction. Each second active region has a second width in the first direction corresponding to at least one and no more than three fin structures extending in the second direction. In some examples, the substrate may be a bulk semiconductor substrate. In some embodiments, the semiconductor substrate is a silicon on insulator (SOI) substrate. In some embodiments, the substrate may include a plurality of epitaxial layers (i.e., a multilayer substrate). The substrate may include an elementary semiconductor such as silicon and germanium. Alternatively, the substrate may include a compound semiconductor such as silicon carbide, silicon phosphide, gallium arsenide, gallium phosphide, indium phosphide, indium arsenide, indium antimonide, zinc oxide, zinc selenide, zinc sulfide, zinc telluride, cadmium selenide, cadmium sulfide, and/or cadmium telluride; an alloy semiconductor, such as SiGe, SiPC, GaAsP, AlInAs, AlGaAs, GaInAs, GaInP, and/or GaInAsP; or combinations thereof. The substrate may include various regions that have been suitably doped (e.g., p-type or n-type conductivity). It should be noted that other types of substrate structures and semiconductor materials are also within the scope of the disclosure.

At step 2304, fin structures are formed over the first active region and the plurality of second active regions. The fin structures (e.g., the fin structures 204 as shown in FIG. 2A) comprises any suitable material. In one example, the fin structure extends in a second direction (e.g., the X direction as shown in FIG. 2A). In one example, the fin structure is a silicon fin structure. In another example, the fin structure may include multiple layers such as one or more epitaxial layers grown on the bulk semiconductor substrate and/or the bulk semiconductor substrate itself. The fin structure may be formed by any suitable process including various deposition, photolithography, etching, epitaxy, and/or other suitable processes. An exemplary photolithography process may include forming a photoresist layer ("resist") overlying the substrate, exposing the resist to a pattern by using a mask, performing a post-exposure bake process, and developing the resist to form a masking element including the resist. The masking element may then be used for etching to form the fin structure. The etching process may be reactive ion etching (RIE) processes and/or other suitable processes. In another example, the fin structure may be formed by a double-patterning lithography (DPL) process. DPL is a method of constructing a pattern on a substrate by dividing the pattern into two interleaved patterns. DPL allows enhanced fin structure density. Various DPL methodologies may be used including double exposure (e.g., using two mask sets), forming spacers adjacent features and removing the features to provide a pattern of spacers, resist freezing, and/or other suitable processes. It should be noted that other types of fin structures and fin structure materials are also within the scope of the disclosure.

At step 2306, source/drain regions of the fin structures are doped. In one example, the source/drain regions of the fin structures are doped by performing implanting process to implant appropriate dopants to complement the dopants in the fin structures. In another example, the source/drain regions of the fin structures may be formed by forming a recess in the fin structure and epitaxially growing material in the recess. It should be noted that other types of source/drain structures and forming processes are within the scope of the disclosure.

At step 2308, gate structures are formed over the fin structures in the first active region and the plurality of second active regions. Each of the gate structures (e.g., the gate strips 208 as shown in FIG. 2A) may include a gate dielectric layer, a gate electrode layer, and/or other suitable layers such as capping layers, interface layers, work function layers, diffusion/barrier layers, etc. A gate structures and/or a fin structure may be patterned such that the gate structure wraps around a portion of the fin structure. In one example, a gate structure may contact at least three surfaces of a fin structure (e.g., the top and opposing side surfaces). In another example, a gate structure wraps around or quasi-around a fin structure such that the gate structure contacts a fourth surface of the fin structure (e.g., the bottom surface). The gate dielectric layer comprises a dielectric material, such as silicon oxide, silicon nitride, high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof. The gate electrode includes any suitable material, such as polysilicon, aluminum, copper, titanium, tantalum, tungsten, molybdenum, tantalum nitride, nickel silicide, cobalt silicide, TiN, WN, TiAl, TiAlN, TaCN, TaC, TaSiN, metal alloys, other suitable materials, and/or combinations thereof. It should be noted that other gate structures and materials are within the scope of the disclosure.

At step 2310, contact structures are deposited, over the source regions and the drain regions, in the first active region and the plurality of second active regions. Specifically, depositing source contact structures and drain contact structures may include, for example, depositing a barrier layer such as titanium nitride, tantalum nitride, tungsten nitride, ruthenium, the like, or a combination thereof, and then depositing a conductive material, such as a metal like aluminum, copper, tungsten, the like, or a combination thereof. The deposition may be by, for example, chemical vapor deposition (CVD), atomic layer deposition (ALD), physical vapor deposition (PVD), the like, or a combination thereof. Excess barrier layer materials and/or conductive materials may be removed later, such as by chemical-mechanical polishing (CMP). In some embodiments, the source contact structures and the drain contact structures are deposited in an inter-layer dielectric (ILD) such as a low-k dielectric layer or extreme low-k dielectric layer. Specifically, the source contact structures and the drain contact structures are formed by forming the interlayer dielectric (ILD), patterning the ILD by using a mask to cover some portions of the ILD while leaving other portions of the ILD exposed, etching the ILD to remove the exposed portions of the ILD to form a recess, and depositing conductive materials in the recess. It should be noted that other types of forming processes and materials are within the scope of the disclosure. As such, individual FinFETs are fabricated in the first active region and the plurality of second active regions.

At step 2312, electrical interconnect structures are formed among the first active region and the plurality of second active regions. The electrical interconnect structures are configured to connect various features or structures of the individual FinFETs located in the first active region and the plurality of second active regions. In some embodiments, the electrical interconnect structures include a multilayer interconnection includes vertical interconnects, such as conventional vias or contacts, and horizontal interconnects, such as metal lines. Those electrical interconnect structures are made of various conductive materials including, but not limited to, copper, tungsten, and/or silicide. In one example, a damascene and/or dual damascene process is used to form a copper related multilayer interconnection structure. As such, the individual FinFETs are connected to function as header switches or footer switches.

Figure 24:
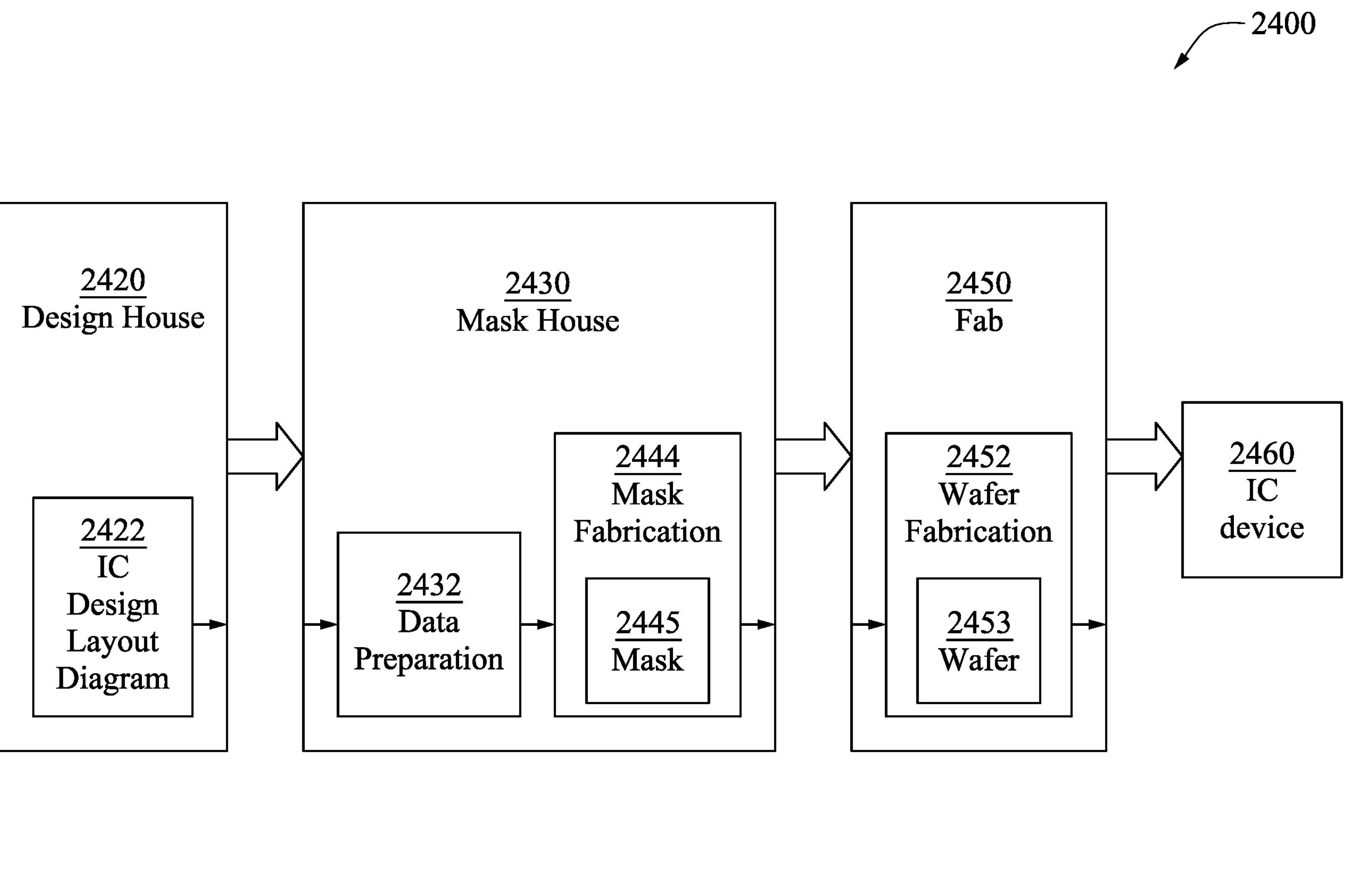
FIG. 24 is a block diagram of IC manufacturing system in accordance with some embodiments.

FIG. 24 is a block diagram of IC manufacturing system in accordance with some embodiments. In FIG. 24, the IC manufacturing system 2400 includes entities, such as a design house 2420, a mask house 2430, and an IC manufacturer/fabricator ("fab") 2450, that interact with one another in the design, development, and manufacturing cycles and/or services related to manufacturing an IC device 2460, such as the power gating cell 102 disclosed above. The entities in the system 2400 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of the design house 2420, mask house 2430, and IC fab 2450 is owned by a single larger company. In some embodiments, two or more of design house 2420, mask house 2430, and IC fab 2450 coexist in a common facility and use common resources.

The design house (or design team) 2420 generates an IC design layout diagram 2422. The IC design layout diagram 2422 includes various geometrical patterns, or IC layout diagrams designed for an IC device 2460, e.g., an IC device including one or more of the disclosed power gating cells 102, discussed above. The geometrical patterns correspond to patterns of metal, oxide, or semiconductor layers that make up the various components of IC device 2460 to be fabricated. The various layers combine to form various IC features. For example, a portion of the IC design layout diagram 2422 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. The design house 2420 implements a design procedure to form an IC design layout diagram 2422. The design procedure includes one or more of logic design, physical design or place and route. The IC design layout diagram 2422 is presented in one or more data files having information of the geometrical patterns. For example, IC design layout diagram 2422 can be expressed in a GDSII file format or DFII file format.

The mask house 2430 includes a data preparation 2432 and a mask fabrication 2444. The mask house 2430 uses the IC design layout diagram 2422 to manufacture one or more masks 2445 to be used for fabricating the various layers of the IC device 2460 according to the IC design layout diagram 2422. The mask house 2430 performs mask data preparation 2432, where the IC design layout diagram 2422 is translated into a representative data file ("RDF"). The mask data preparation 2432 provides the RDF to the mask fabrication 2444. The mask fabrication 2444 includes a mask writer. A mask writer converts the RDF to an image on a substrate, such as a mask (reticle) 2445 or a semiconductor wafer 2453. The design layout diagram 2422 is manipulated by the mask data preparation 2432 to comply with particular characteristics of the mask writer and/or requirements of the IC fab 2450. In FIG. 24, the mask data preparation 2432 and the mask fabrication 2444 are illustrated as separate elements. In some embodiments, the mask data preparation 2432 and the mask fabrication 2444 can be collectively referred to as a mask data preparation.

In some embodiments, the mask data preparation 2432 includes an optical proximity correction (OPC) which uses lithography enhancement techniques to compensate for image errors, such as those that can arise from diffraction, interference, other process effects and the like. The OPC adjusts the IC design layout diagram 2422. In some embodiments, the mask data preparation 2432 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, the mask data preparation 2432 includes a mask rule checker (MRC) that checks the IC design layout diagram 2422 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 2422 to compensate for limitations during the mask fabrication 2444, which may undo part of the modifications performed by OPC in order to meet mask creation rules.

In some embodiments, the mask data preparation 2432 includes lithography process checking (LPC) that simulates processing that will be implemented by the IC fab 2450 to fabricate the IC device 2460. LPC simulates this processing based on the IC design layout diagram 2422 to create a simulated manufactured device, such as the IC device 2460. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine the IC design layout diagram 2422.

It should be understood that the above description of mask data preparation 2432 has been simplified for the purposes of clarity. In some embodiments, data preparation 2432 includes additional features such as a logic operation (LOP) to modify the IC design layout diagram 2422 according to manufacturing rules. Additionally, the processes applied to the IC design layout diagram 2422 during data preparation 2432 may be executed in a variety of different orders.

After the mask data preparation 2432 and during the mask fabrication 2444, a mask 2445 or a group of masks 2445 are fabricated based on the modified IC design layout diagram 2422. In some embodiments, the mask fabrication 2444 includes performing one or more lithographic exposures based on the IC design layout diagram 2422. In some embodiments, an electron-beam (e-beam) or a mechanism of multiple e-beams is used to form a pattern on a mask (photomask or reticle) 2445 based on the modified IC design layout diagram 2422. The mask 2445 can be formed in various technologies. In some embodiments, the mask 2445 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of the mask 2445 includes a transparent substrate (e.g., fused quartz) and an opaque material (e.g., chromium) coated in the opaque regions of the binary mask. In another example, the mask 2445 is formed using a phase shift technology. In a phase shift mask (PSM) version of the mask 2445, various features in the pattern formed on the phase shift mask are configured to have proper phase difference to enhance the resolution and imaging quality. In various examples, the phase shift mask can be attenuated PSM or alternating PSM. The mask(s) generated by the mask fabrication 2444 is used in a variety of processes. For example, such a mask(s) is used in an ion implantation process to form various doped regions in the semiconductor wafer 2453, in an etching process to form various etching regions in the semiconductor wafer 2453, and/or in other suitable processes.

The IC fab 2450 includes wafer fabrication 2452. The IC fab 2450 is an IC fabrication business that includes one or more manufacturing facilities for the fabrication of a variety of different IC products. In some embodiments, the IC Fab 2450 is a semiconductor foundry. For example, there may be a manufacturing facility for the front end fabrication of a plurality of IC products (FEOL fabrication), while a second manufacturing facility may provide the back end fabrication for the interconnection and packaging of the IC products (BEOL fabrication), and a third manufacturing facility may provide other services for the foundry business.

The IC fab 2450 uses mask(s) 2445 fabricated by the mask house 2430 to fabricate the IC device 2460. Thus, the IC fab 2450 at least indirectly uses the IC design layout diagram 2422 to fabricate the IC device 2460. In some embodiments, the semiconductor wafer 2453 is fabricated by the IC fab 2450 using mask(s) 2445 to form the IC device 2460. In some embodiments, the IC fabrication includes performing one or more lithographic exposures based at least indirectly on the IC design layout diagram 2422. The Semiconductor wafer 2453 includes a silicon substrate or other proper substrate having material layers formed thereon. The semiconductor wafer 2453 further includes one or more of various doped regions, dielectric features, multilevel interconnects, and the like (formed at subsequent manufacturing steps).

In accordance with some disclosed embodiments, a power gating cell on an integrated circuit is provided. The power gating cell includes: a central area; a peripheral area surrounding the central area; a first active region located in the central area, the first active region having a first width in a first direction corresponding to at least four fin structures extending in a second direction perpendicular to the first direction; and a plurality of second active regions located in the peripheral area, each second active region having a second width in the first direction corresponding to at least one and no more than three fin structures extending in the second direction.

In accordance with some disclosed embodiments, an integrated circuit is provided. The integrated circuit includes: a standard logic cell configured to fulfil a function; and a power gating cell coupled to the standard logic cell configured to disconnect a power supply to the standard logic cell in response to a control signal, the power gating cell having a central area and a peripheral area surrounding the central area. The power gating cell further includes: a first active region located in the central area, the first active region having a first width in a first direction corresponding to at least four fin structures extending in a second direction perpendicular to the first direction; and a plurality of second active regions located in the peripheral area, each second active region having a second width in the first direction corresponding to at least one and no more than three fin structures extending in the second direction.

In accordance with further disclosed embodiments, a method of fabricating a power gating cell on an integrated circuit is provided. The method includes: providing a substrate, wherein there is a first active region and a plurality of second active regions on the substrate, the first active region located in a central area of the power gating cell and having a first width in a first direction corresponding to at least four fin structures extending in a second direction perpendicular to the first direction, the plurality of second active regions located in a peripheral area of the power gating cell surrounding the central area, each second active region having a second width in the first direction corresponding to at least one and no more than three fin structures extending in the second direction; forming fin structures over the first active region and the plurality of second active regions; doping source regions and drain regions of the fin structures; and forming gate structures over the fin structures in the first active region and the plurality of second active regions.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A power gating cell on an integrated circuit, comprising:
- a central area;
- a peripheral area adjacent the central area;
- a first active region located in the central area, the first active region having a first width in a first direction corresponding to at least four fin structures extending in a second direction perpendicular to the first direction;
- a plurality of second active regions located in the peripheral area, each second active region having a second width in the first direction corresponding to at least one and no more than three fin structures extending in the second direction; and
- a third active region located in the central area, the third active region separated from the first active region and having a third width in the first direction corresponding to at least four fin structures extending in the second direction perpendicular to the first direction,
- wherein the power gating cell is a header cell configured to cut off a power supply to a standard logic cell on the integrated circuit in response to a control signal.

2. The power gating cell of claim 1, wherein the integrated circuit has a set of global fin grids extending in the second direction, and the at least four fin structures corresponding to the first active region are aligned with the set of global fin grids.

3. The power gating cell of claim 1, wherein the at least one and no more than three fin structures corresponding to each of the plurality of second active regions are not aligned with the set of global fin grids.

4. The power gating cell of claim 1, wherein the second width corresponds to one fin structure.

5. The power gating cell of claim 1, wherein the second width corresponds to two fin structures.

6. The power gating cell of claim 1, wherein the second width corresponds to three fin structures.

7. The power gating cell of claim 1, wherein the peripheral area surrounds the central area.

8. A power gating cell on an integrated circuit, comprising:

a central area;

a peripheral area adjacent the central area;

a first active region located in the central area, the first active region having a first width in a first direction corresponding to at least four fin structures extending in a second direction perpendicular to the first direction;

a plurality of second active regions located in the peripheral area, each second active region having a second width in the first direction corresponding to at least one and no more than three fin structures extending in the second direction; and a third active region located in the central area, the third active region separated from the first active region and having a third width in the first direction corresponding to at least four fin structures extending in the second direction perpendicular to the first direction, wherein the power gating cell is a footer cell configured to cut off a power supply to a standard logic cell on the integrated circuit in response to a control signal.

9. The power gating cell of claim 8, wherein the integrated circuit has a set of global fin grids extending in the second direction, and the at least four fin structures corresponding to the first active region are aligned with the set of global fin grids.

10. The power gating cell of claim 8, wherein the at least one and no more than three fin structures corresponding to each of the plurality of second active regions are not aligned with the set of global fin grids.

11. The power gating cell of claim 8, wherein the second width corresponds to one fin structure.

12. The power gating cell of claim 8, wherein the second width corresponds to two fin structures.

13. The power gating cell of claim 8, wherein the second width corresponds to three fin structures.

14. A power gating cell on an integrated circuit, comprising:

a central area;

a peripheral area adjacent the central area;

a first active region located in the central area, the first active region having a first width in a first direction corresponding to at least four fin structures extending in a second direction perpendicular to the first direction;

a plurality of second active regions located in the peripheral area, each second active region having a second width in the first direction corresponding to at least one and no more than three fin structures extending in the second direction; and a third active region located in the central area, the third active region separated from the first active region and having a third width in the first direction corresponding to at least four fin structures extending in the second direction perpendicular to the first direction.

15. The power gating cell of claim 14, wherein the integrated circuit has a set of global fin grids extending in the second direction, and the at least four fin structures corresponding to the first active region are aligned with the set of global fin grids.

16. The power gating cell of claim 14, wherein the at least one and no more than three fin structures corresponding to each of the plurality of second active regions are not aligned with the set of global fin grids.

17. The power gating cell of claim 14, wherein the second width corresponds to one fin structure.

18. The power gating cell of claim 14, wherein the second width corresponds to two fin structures.

19. The power gating cell of claim 14, wherein the second width corresponds to three fin structures.

20. The power gating cell of claim 14, wherein the peripheral area surrounds the central area.

* * * * *